US010965035B2

(12) United States Patent
Rodríguez et al.

(10) Patent No.: US 10,965,035 B2
(45) Date of Patent: *Mar. 30, 2021

(54) RECONFIGURABLE ANTENNA SYSTEMS WITH GROUND TUNING PADS

(71) Applicant: Skyworks Solutions, Inc., Irvine, CA (US)

(72) Inventors: René Rodríguez, Rancho Santa Margarita, CA (US); Dinhphuoc Vu Hoang, Anaheim, CA (US); Hardik Bhupendra Modi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 15/982,155

(22) Filed: May 17, 2018

(65) Prior Publication Data
US 2018/0337458 A1   Nov. 22, 2018

Related U.S. Application Data

(60) Provisional application No. 62/507,938, filed on May 18, 2017.

(51) Int. Cl.
*H01Q 1/38* (2006.01)
*H01Q 9/30* (2006.01)
(Continued)

(52) U.S. Cl.
CPC ............. *H01Q 9/30* (2013.01); *H01Q 1/2266* (2013.01); *H01Q 9/0442* (2013.01); *H01Q 9/28* (2013.01);
(Continued)

(58) Field of Classification Search
None
See application file for complete search history.

(56) References Cited

U.S. PATENT DOCUMENTS 5,231,410 A   7/1993   Murakami et al.
5,673,053 A   9/1997   Marthinsson
(Continued)

FOREIGN PATENT DOCUMENTS

KR   10-2009-0057350 A   6/2009

OTHER PUBLICATIONS

Suzuki et al., "An Integrated Configuration of Antennas and Filters for Front-End Module in Massive-MIMO Transmitter" IEEE International Symposium on Radio-Frequency Integration Technology 2015, 3 pages.
(Continued)

*Primary Examiner* — Trinh V Dinh
(74) *Attorney, Agent, or Firm* — Knobbe, Martens, Olson & Bear, LLP

(57) ABSTRACT

Reconfigurable antenna systems with ground tuning pads are provided herein. In certain configurations, an antenna system includes a module substrate including a ground plane and a ground tuning pad configured to receive a ground voltage from the ground plane. The antenna system further includes an antenna element and a tuning conductor that is spaced apart from the antenna element and operable to load the antenna element. Furthermore, a switch is electrically connected between the tuning conductor and the ground tuning pad, and operates to selectively connect the tuning conductor to the ground plane by way of the ground tuning pad to provide tuning to the antenna element.

20 Claims, 17 Drawing Sheets

(51) Int. Cl.
*H01Q 9/04* (2006.01)
*H01Q 1/22* (2006.01)
*H01Q 9/28* (2006.01)
*H05K 1/16* (2006.01)

(52) U.S. Cl.
CPC ..... *H05K 1/165* (2013.01); *H05K 2201/1003* (2013.01)

(56) References Cited

U.S. PATENT DOCUMENTS

| | | | |
|---|---|---|---|
| 5,966,097 A * | 10/1999 | Fukasawa | H01Q 9/40 343/700 MS |
| 6,061,025 A * | 5/2000 | Jackson | H01Q 1/38 343/700 MS |
| 6,501,427 B1 * | 12/2002 | Lilly | H01Q 1/38 333/33 |
| 6,828,938 B2 | 12/2004 | Tran | |
| 6,844,852 B1 | 1/2005 | Simons | |
| 7,068,234 B2 | 6/2006 | Sievenpiper | |
| 7,260,424 B2 | 8/2007 | Schmidt | |
| 7,372,406 B2 * | 5/2008 | Shiotsu | G06F 1/1616 343/700 MS |
| 7,868,829 B1 | 1/2011 | Colburn et al. | |
| 7,952,533 B2 | 5/2011 | Hur et al. | |
| 8,369,796 B2 | 2/2013 | Pan et al. | |
| 8,380,132 B2 | 2/2013 | Nagy | |
| 8,654,034 B2 | 2/2014 | Legare | |
| 8,659,480 B2 | 2/2014 | Wilkins | |
| 8,967,485 B2 | 3/2015 | Piazza et al. | |
| 9,002,431 B2 | 4/2015 | Jones | |
| 9,077,082 B2 | 7/2015 | Tatarnikov et al. | |
| 9,203,144 B2 | 12/2015 | De Luis et al. | |
| 9,236,955 B2 | 1/2016 | Bahl et al. | |
| 9,379,449 B2 | 6/2016 | Cetiner et al. | |
| 9,537,201 B2 | 1/2017 | Alexopoulos et al. | |
| 9,711,849 B1 | 7/2017 | Chen et al. | |
| 9,793,597 B2 * | 10/2017 | Shamblin | H01Q 1/243 |
| 9,859,617 B1 | 1/2018 | Desclos et al. | |
| 9,941,584 B2 | 4/2018 | Kona et al. | |
| 9,941,593 B2 | 4/2018 | Ozdemir | |
| 10,038,240 B2 | 7/2018 | Patron et al. | |
| 10,439,288 B2 * | 10/2019 | Rodriguez | H01Q 9/16 |
| 2003/0098812 A1 * | 5/2003 | Ying | H01Q 1/243 343/702 |
| 2005/0248418 A1 * | 11/2005 | Govind | H03H 7/09 331/179 |
| 2006/0152411 A1 * | 7/2006 | Iguchi | H01Q 1/36 343/700 MS |
| 2006/0281423 A1 | 12/2006 | Caimi et al. | |
| 2007/0069958 A1 * | 3/2007 | Ozkar | H01Q 9/0421 343/700 MS |
| 2009/0236701 A1 * | 9/2009 | Sun | G06F 30/367 257/665 |
| 2009/0322619 A1 | 12/2009 | Ollikainen et al. | |
| 2010/0304693 A1 | 12/2010 | Uejima et al. | |
| 2013/0099987 A1 | 4/2013 | Desclos et al. | |
| 2013/0147672 A1 | 6/2013 | Desclos et al. | |
| 2015/0022408 A1 | 1/2015 | Shamblin et al. | |
| 2016/0134349 A1 | 5/2016 | Ljung et al. | |
| 2016/0302319 A1 | 10/2016 | Ferretti et al. | |
| 2016/0352006 A1 * | 12/2016 | Shtrom | H01Q 9/0442 |
| 2018/0198212 A1 | 7/2018 | Rodríguez | |
| 2018/0263561 A1 | 9/2018 | Jones | |
| 2018/0294569 A1 | 10/2018 | Hoang et al. | |
| 2020/0099134 A1 | 3/2020 | Rodríguez | |

OTHER PUBLICATIONS

Zetterberg et al., Project Name: Millimetre-Wave Based Mobile Radio Access Network for Fifth Generation Integrated Communications (mmMAGIC), "Initial multi-node and antenna transmitter and receiver architectures and schemes," dated Mar. 31, 2016, 140 pages.

International Search Report and Written Opinion of the International Searching Authority for International Application No. PCT/US2017/065172, dated Mar. 29, 2018 in 14 pages.

* cited by examiner

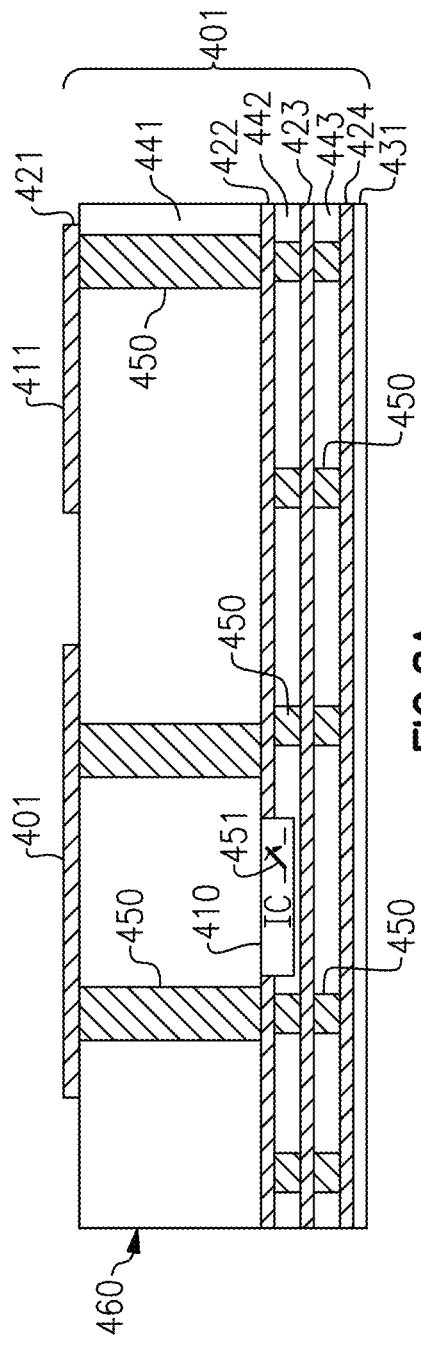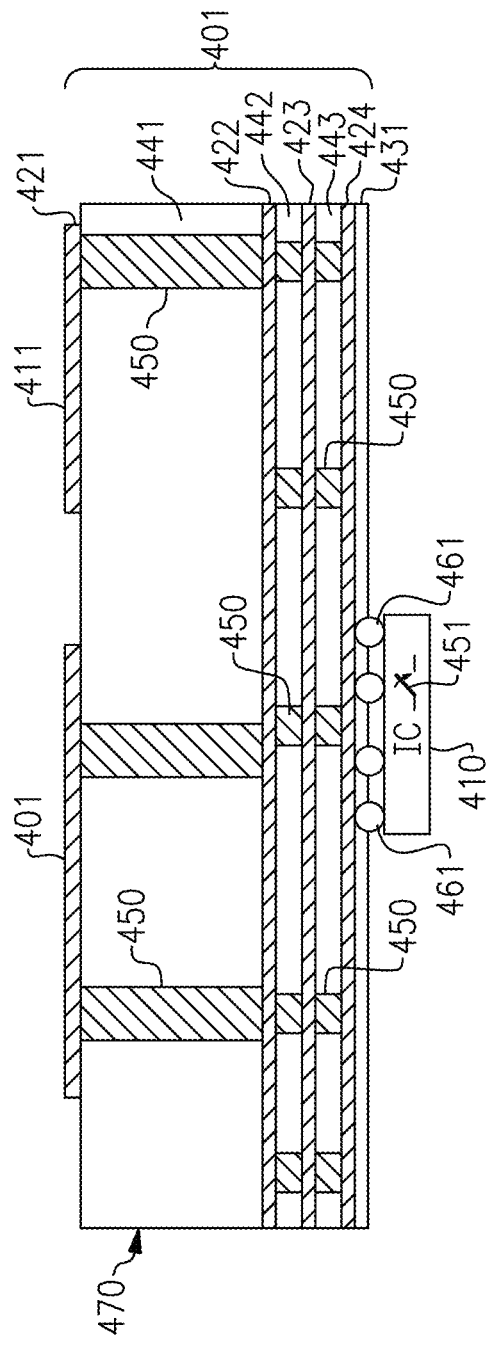

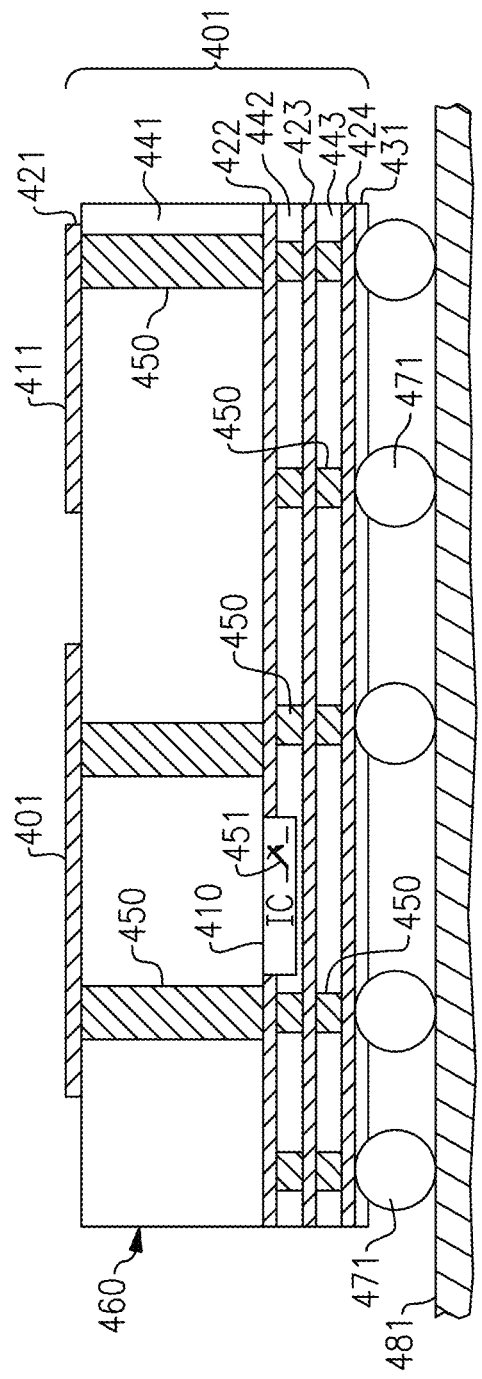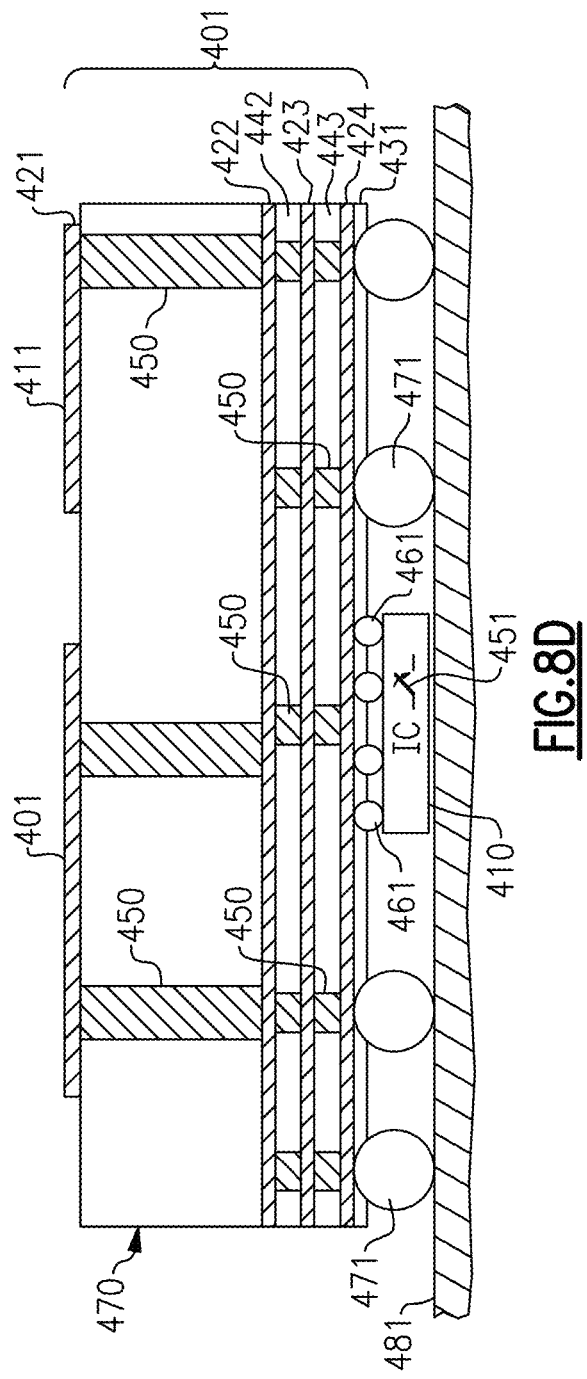

RECONFIGURABLE ANTENNA SYSTEMS WITH GROUND TUNING PADS

CROSS-REFERENCE TO RELATED APPLICATIONS

This application claims the benefit of priority under 35 U.S.C. § 119 of U.S. Provisional Patent Application No. 62/507,938, filed May 18, 2017 and titled "RECONFIGURABLE ANTENNA SYSTEM WITH GROUND TUNING PADS," which is herein incorporated by reference in its entirety.

BACKGROUND

Field

Embodiments of the invention relate to electronic systems, and in particular, to radio frequency (RF) electronics.

Description of Related Technology

A radio frequency (RF) communication system can include a transceiver, a front end, and one or more antennas for wirelessly transmitting and receiving signals. The front end can include low noise amplifier(s) for amplifying signals received via the antenna(s), and power amplifier(s) for boosting signals for transmission via the antenna(s).

Examples of RF communication systems include, but are not limited to, mobile phones, tablets, base stations (including macro cell base stations and small cell base stations), network access points, customer-premises equipment (CPE), laptops, and wearable electronics.

SUMMARY

In certain embodiments, the present disclosure relates to an antenna system. The antenna system includes a first antenna element, a first tuning conductor spaced apart from the first antenna element and operable to load the first antenna element, a first ground tuning pad configured to receive a ground voltage, and a first switch electrically connected between the first tuning conductor and the first ground tuning pad. The first switch is operable to selectively connect the first tuning conductor to the ground voltage by way of the first ground tuning pad to thereby tune the first antenna element.

In some embodiments, a state of the first switch is operable to tune a bandwidth of the first antenna element.

In various embodiments, the first ground tuning pad includes a plurality of metal regions of different widths, and the plurality of metal regions having an impedance that modifies a resonant frequency of the first antenna element when the first switch is closed.

In a number of embodiments, the antenna system further includes a second ground tuning pad configured to receive the ground voltage, a second tuning conductor adjacent to and spaced apart from the first antenna element and operable to load the first antenna element, and a second switch electrically connected between the second tuning conductor and the second ground tuning pad. According to several embodiments, the first tuning conductor and the second tuning conductor are positioned along different sides of the first antenna element.

In some embodiments, the antenna system further includes a second antenna element, and the first tuning conductor is spaced apart from the second antenna element and operable to load the second antenna element.

In several embodiments, the antenna system further includes a second antenna element, a second ground tuning pad configured to receive the ground voltage, and a second switch electrically connected between the second tuning conductor and the second ground tuning pad. In accordance with a number of embodiments, the second tuning conductor spaced apart from the second antenna element and operable to load the second antenna element.

In various embodiments, the first switch is operable to ground the first tuning conductor in a first state and to electrically float the first tuning conductor in a second state.

In a number of embodiments, the first antenna element is a patch antenna, a dipolar antenna, a ceramic resonator, a stamped metal antenna, or a laser direct structuring antenna.

In several embodiments, the first ground tuning pad and the first switch are integrated on a module substrate. According to various embodiments, the module substrate includes at least one conductive layer including a ground plane, and the first ground tuning pad is configured to receive the ground voltage from the ground plane. In accordance with a number of embodiments, the first antenna element and the first tuning conductor are integrated on the module substrate. According to some embodiments, the first antenna element and the first tuning conductor are integrated on a glass substrate that is coupled to the module substrate.

In certain embodiments, the present disclosure relates to a radio frequency module. The radio frequency module includes a module substrate including a ground plane, a ground tuning pad configured to receive a ground voltage from the ground plane, a via in the module substrate, and a switch electrically connected between the via and the ground tuning pad The via is configured to couple to a tuning conductor that loads an antenna element, and the switch is operable to selectively connect the via to the ground plane by way of the ground tuning pad to thereby tune the antenna element.

In a number of embodiments, the ground tuning pad and the ground plane are formed on a common conductive layer of the module substrate.

In various embodiments, the ground tuning pad includes a plurality of metal regions of different widths, and the plurality of metal regions having an impedance that modifies a resonant frequency of the antenna element when the switch is closed.

In several embodiments, the antenna element and the tuning conductor are implemented on a common conductive layer of the module substrate.

In some embodiments, a state of the switch is operable to tune a bandwidth of the antenna element.

In certain embodiments, the present disclosure relates to a mobile device. The mobile device includes a power amplifier configured to generate a radio frequency transmit signal, an antenna element including a signal feed configured to receive the radio frequency transmit signal, a tuning conductor spaced apart from the antenna element and operable to load the antenna element, a ground tuning pad configured to receive a ground voltage, and a switch electrically connected between the tuning conductor and the ground tuning pad. The switch is operable to selectively connect the tuning conductor to the ground voltage by way of the ground tuning pad to thereby tune the antenna element.

In a number of embodiments, a state of the switch is operable to tune a bandwidth of the antenna element.

In certain embodiments, the present disclosure relates to a radio frequency module. The radio frequency module includes a module substrate including a ground plane, a first ground tuning pad configured to receive a ground voltage from the ground plane, a first antenna element on a first side of the module substrate, a first tuning conductor adjacent to and spaced apart from the first antenna element on the first side of the module substrate, and a first switch electrically connected between the first tuning conductor and the first ground tuning pad. The first tuning conductor is operable to load the first antenna element, and the first switch is operable to selectively connect the first tuning conductor to the ground plane by way of the first ground tuning pad so as to tune the first antenna element.

In a number of embodiments, the first ground tuning pad and the ground plane are formed on a common conductive layer of the module substrate.

In some embodiments, the first ground tuning pad includes a plurality of conductive regions of different widths. According to several embodiments, the plurality of regions of different widths includes at least one narrow region operable to serve as a tuning inductor and at least one wide region operable to serve as a tuning capacitor. In accordance with various embodiments, the plurality of regions of different widths includes a wide region and a plurality of narrow regions connected between the wide region and the ground plane.

In several embodiments, a state of the first switch is operable to tune a bandwidth of the first antenna element.

In a number of embodiments, a state of the first switch is operable to steer a direction of polarization of the first antenna element.

In various embodiments, the radio frequency module further includes a semiconductor die including the first switch. In accordance with some embodiments, the semiconductor die is embedded in an internal layer of the module substrate. According to several embodiments, the semiconductor die is on a second side of the module substrate opposite the first side.

In some embodiments, the radio frequency module further includes a second ground tuning pad electrically connected to the ground plane, a second tuning conductor adjacent to and spaced apart from the first antenna element and operable to load the first antenna element, and a second switch electrically connected between the second tuning conductor and the second ground tuning pad.

In various embodiments, the first tuning conductor and the second tuning conductor are positioned along different sides of the first antenna element.

In a number of embodiments, the module substrate is a laminate.

In several embodiments, the first antenna element is configured to receive radio waves.

In a number of embodiments, the first antenna element is configured to transmit radio waves.

In various embodiments, the first antenna element is configured to both transmit and receive radio waves.

In some embodiments, the radio frequency module further includes a second antenna element on the first side of the module substrate adjacent to the first antenna element. According to a number of embodiments, the first tuning conductor is adjacent to and spaced apart from the second antenna element and is operable to load the second antenna element. In accordance with several embodiments, the radio frequency module further includes a second ground tuning pad electrically connected to the ground plane, a second tuning conductor adjacent to and spaced apart from the second antenna element and operable to load the second antenna element, and a second switch electrically connected between the second tuning conductor and the second ground tuning pad.

In a number of embodiments, the first switch is operable to ground the first tuning conductor in a first state and to electrically float the first tuning conductor in a second state.

In several embodiments, the first switch is a field-effect transistor switch.

In some embodiments, the first antenna element is a patch antenna, a dipolar antenna, a ceramic resonator, a stamped metal antenna, or a laser direct structuring antenna.

In a number of embodiments, the radio frequency module further includes an antenna array on the first side of the module substrate and including a plurality of antenna elements including the first antenna element. According to several embodiments, the antenna array is operable to provide beamforming. In accordance with various embodiments, the antenna array is operable to provide multi-input and multiple output communications.

In certain embodiments, the present disclosure relates to a mobile communication device for operating in a wireless network. The mobile communication device includes a first antenna element, a first tuning conductor adjacent to and spaced apart from the first antenna element, a first ground tuning pad configured to receive a ground voltage, and a first switch electrically connected between the first tuning conductor and the first ground tuning pad. The first tuning conductor is operable to load the first antenna element, and the first switch is operable to selectively connect the first tuning conductor to the ground voltage by way of the first ground tuning pad so as to tune the first antenna element.

In a number of embodiments, the first ground tuning pad includes a plurality of conductive regions of different widths. According to several embodiments, the plurality of regions of different widths includes at least one narrow region operable to serve as a tuning inductor and at least one wide region operable to serve as a tuning capacitor. In accordance with various embodiments, the plurality of regions of different widths includes a wide region and a plurality of narrow regions configured to provide the ground voltage to the wide region.

In some embodiments, a state of the first switch is operable to tune a bandwidth of the first antenna element.

In various embodiments, a state of the first switch is operable to steer a direction of polarization of the first antenna element.

In a number of embodiments, the mobile communication device further includes a semiconductor die including the first switch.

In several embodiments, the mobile communication device further includes a second ground tuning pad configured to receive the ground voltage, a second tuning conductor adjacent to and spaced apart from the first antenna element and operable to load the first antenna element, and a second switch electrically connected between the second tuning conductor and the second ground tuning pad. In according with various embodiments, the first tuning conductor and the second tuning conductor are positioned along different sides of the first antenna element.

In a number of embodiments, the mobile communication device further includes a front end system and a transceiver electrically coupled to the first antenna element via the front end system. In accordance with some embodiments, the front end system includes a power amplifier configured to provide a transmit radio frequency signal to the first antenna element. According to several embodiments, the front end system includes a low noise amplifier configured to amplify a radio frequency signal received from the first antenna element.

In various embodiments, the mobile communication device further includes a second antenna element adjacent to the first antenna element. According to a number of embodiments, the first tuning conductor is adjacent to and spaced apart from the second antenna element and is operable to load the second antenna element. In accordance with several embodiments, the mobile communication device further includes a second ground tuning pad configured to receive the ground voltage, a second tuning conductor adjacent to and spaced apart from the second antenna element and operable to load the second antenna element, and a second switch electrically connected between the second tuning conductor and the second ground tuning pad.

In a number of embodiments, the first switch is operable to ground the first tuning conductor in a first state and to electrically float the first tuning conductor in a second state.

In various embodiments, the first switch is a field-effect transistor switch.

In several embodiments, the first antenna element is a patch antenna, a dipolar antenna, a ceramic resonator, a stamped metal antenna, or a laser direct structuring antenna.

In some embodiments, the mobile communication device further includes an antenna array including a plurality of antenna elements including the first antenna element. In accordance with a number of embodiments, the antenna array is operable to provide beamforming. According to various embodiments, the antenna array is operable to provide multi-input and multiple output communications.

In certain embodiments, the present disclosure relates to a base station for a wireless network. The base station includes a first antenna element, a first tuning conductor adjacent to and spaced apart from the first antenna element, a first ground tuning pad configured to receive a ground voltage, and a first switch electrically connected between the first tuning conductor and the first ground tuning pad. The first tuning conductor is operable to load the first antenna element, and the first switch is operable to selectively connect the first tuning conductor to the ground voltage by way of the first ground tuning pad so as to tune the first antenna element.

BRIEF DESCRIPTION OF THE DRAWINGS

Embodiments of this disclosure will now be described, by way of non-limiting example, with reference to the accompanying drawings.

FIG. 8A is a cross-section of another embodiment of an RF module.

FIG. 8B is a cross-section of another embodiment of an RF module.

FIG. 8C is a cross-section of the RF module of FIG. 8A attached to a printed circuit board according to one embodiment.

FIG. 8D is a cross-section of the RF module of FIG. 8B attached to a printed circuit board according to one embodiment.

DETAILED DESCRIPTION OF CERTAIN EMBODIMENTS

Figure 1:
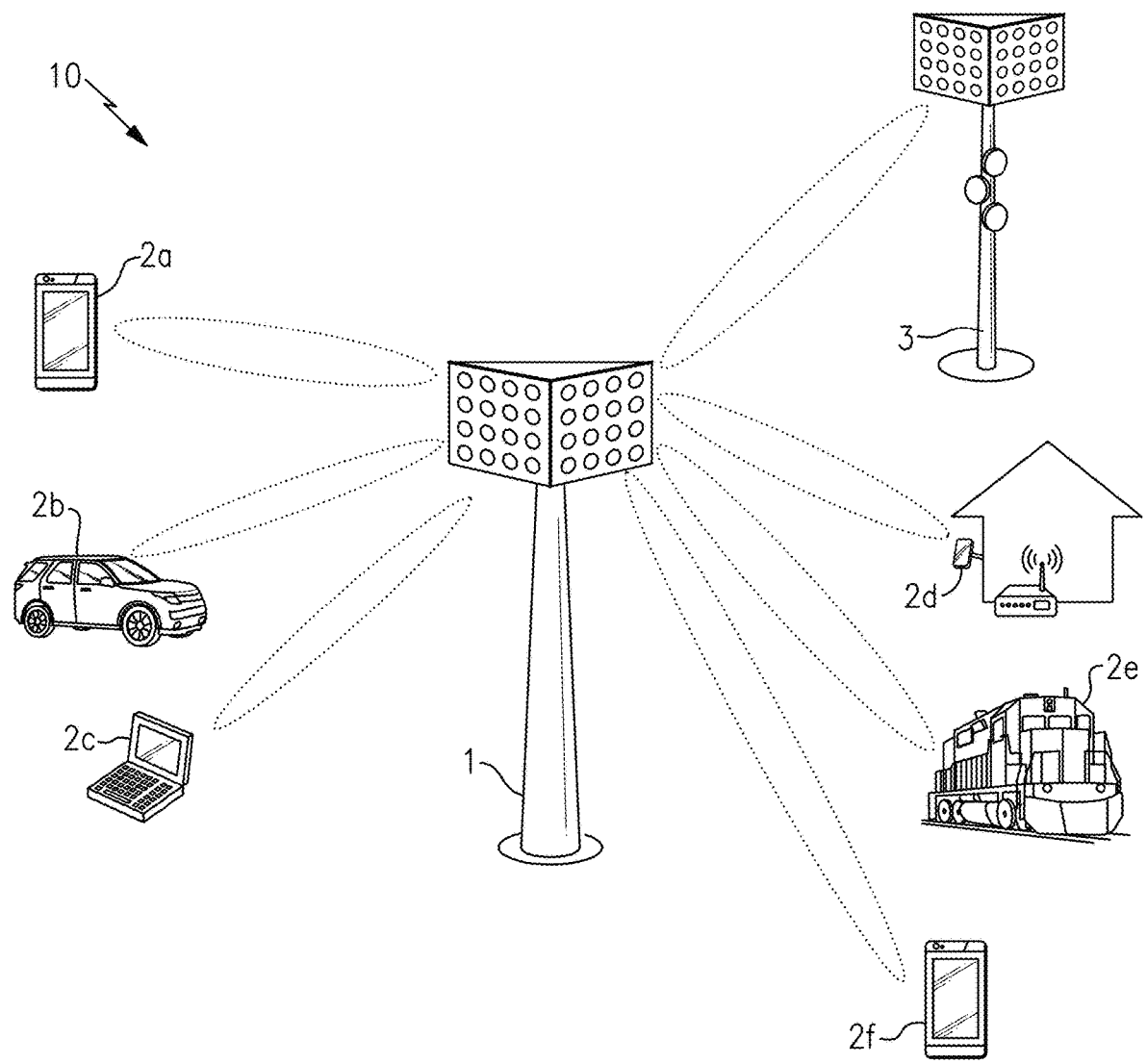
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
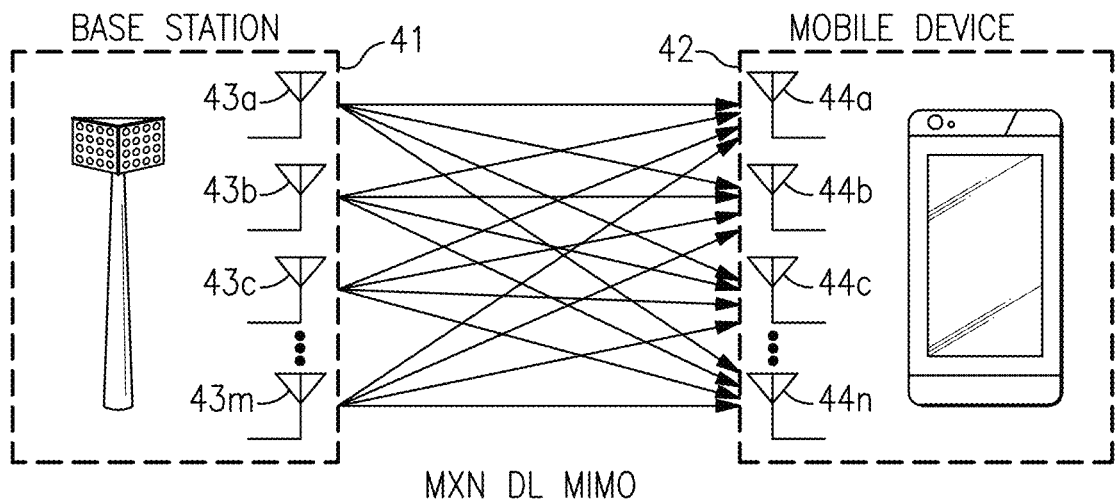
FIG. 2A is a schematic diagram of one example of a downlink channel using multi-input and multi-output (MIMO) communications.
Figure 2B:
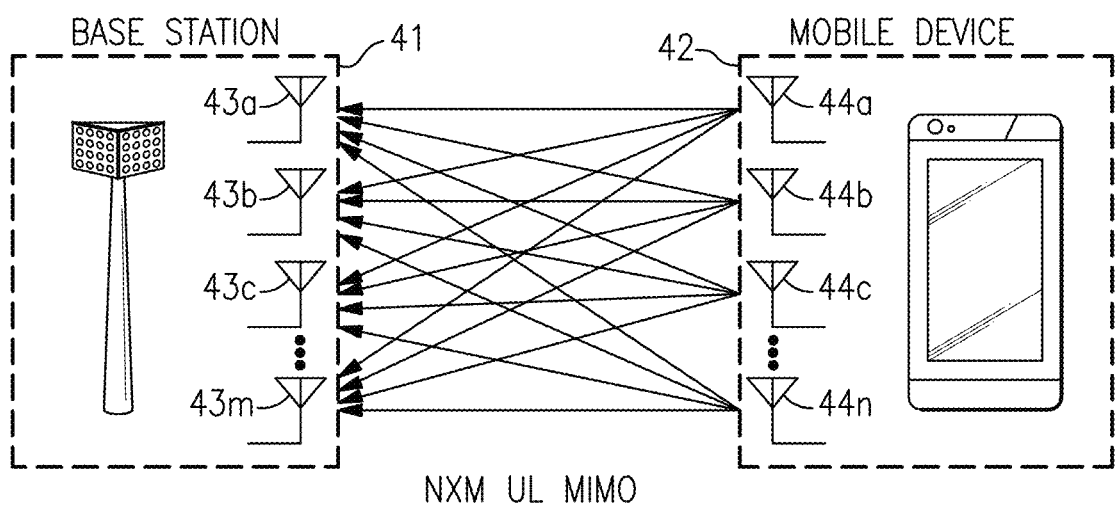
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas $43a$, $43b$, $43c$, ... $43m$ of the base station 41 and receiving using N antennas $44a$, $44b$, $44c$, ... $44n$ of the mobile device 42. Accordingly, FIG. 2A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas $44a$, $44b$, $44c$, ... $44n$ of the mobile device 42 and receiving using M antennas $43a$, $43b$, $43c$, ... $43m$ of the base station 41. Accordingly, FIG. 2B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3:
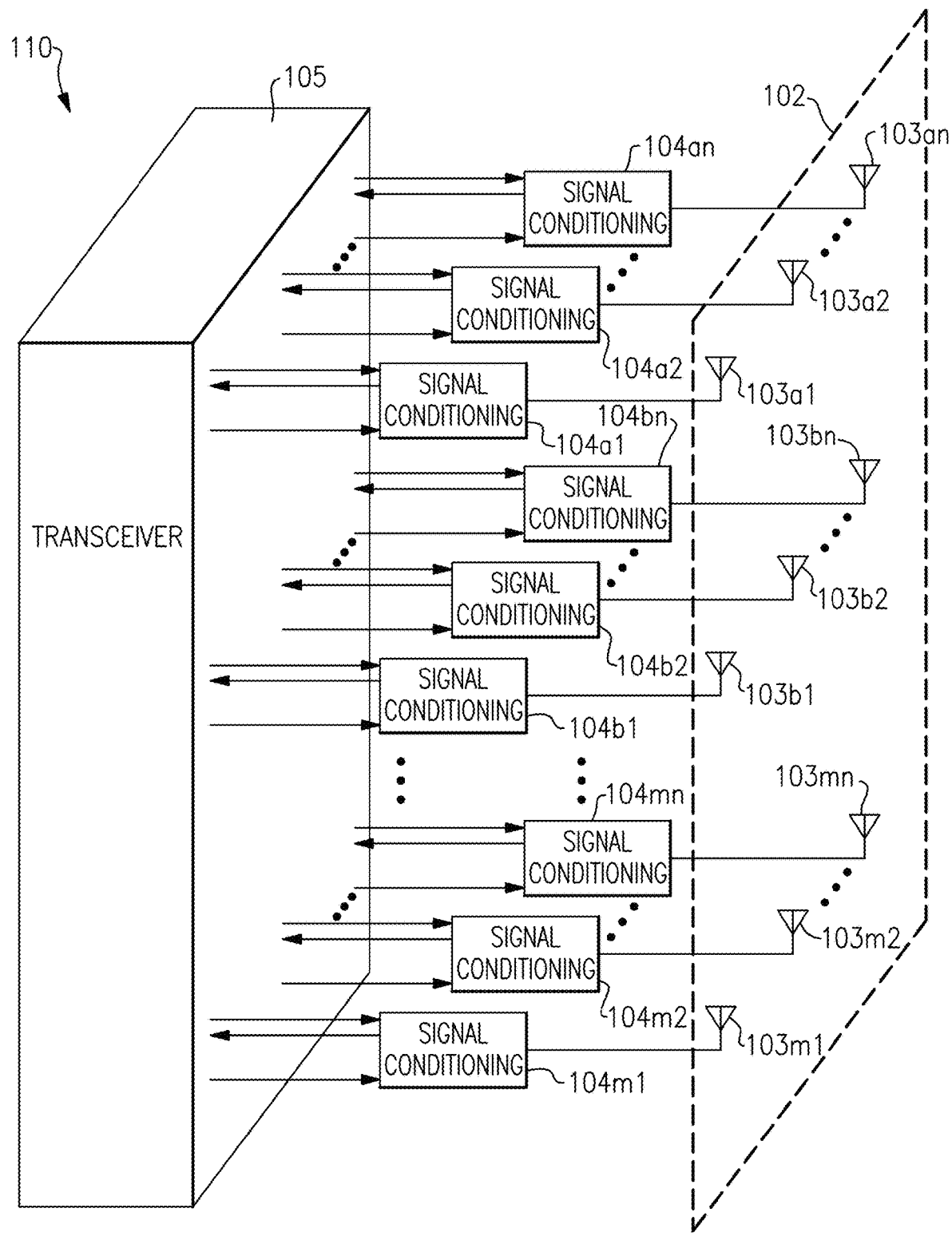
FIG. 3 is a schematic diagram of one example of a communication system that operates with beamforming.

FIG. 3 is a schematic diagram of one example of a communication system 110 that operates with beamforming. The communication system 110 includes a transceiver 105, signal conditioning circuits $104a1$, $104a2$ ... $104an$, $104b1$, $104b2$ ... $104bn$, $104m1$, $104m2$ ... $104mn$, and an antenna array 102 that includes antenna elements $103a1$, $103a2$ ... $103an$, $103b1$, $103b2$ ... $103bn$, $103m1$, $103m2$ ... $103mn$. In one embodiment at least a portion of the antenna elements $103a1$, $103a2$ ... $103an$, $103b1$, $103b2$ ... $103bn$, $103m1$, $103m2$ ... $103mn$ are loaded by one or more tuning conductors to provide antenna configurability in accordance with the teachings herein.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 3, the transceiver 105 generates control signals for the signal conditioning circuits. The control signals can be used for a variety of functions, such as controlling the phase of transmitted or received signals to control beam forming.

Figure 4A:
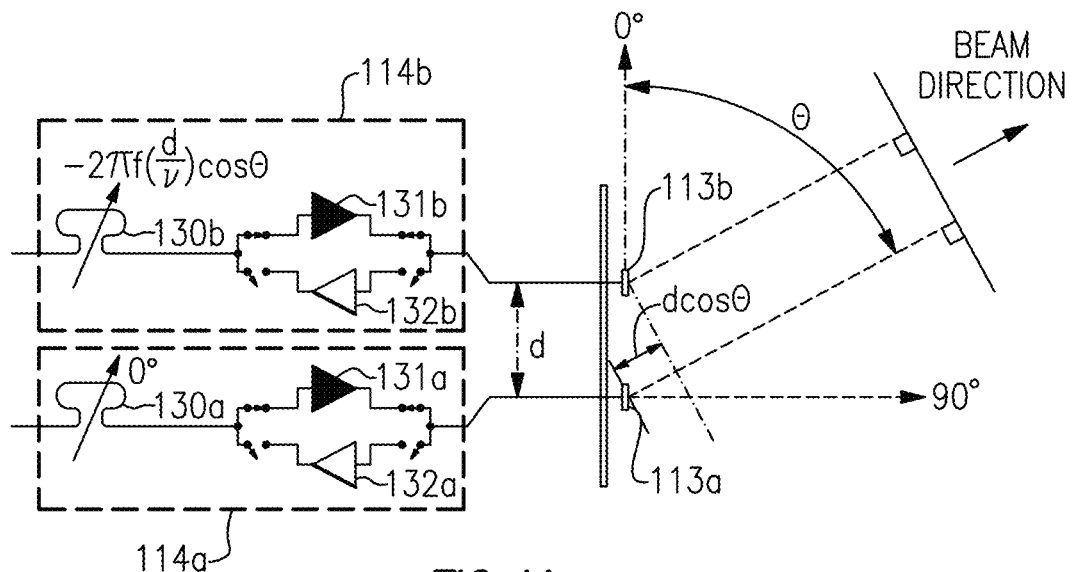
FIG. 4A is a schematic diagram of one example of beamforming to provide a transmit beam.

FIG. 4A is a schematic diagram of one example of beamforming to provide a transmit beam. FIG. 4A illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4A illustrates one embodiment of a portion of the communication system 110 of FIG. 3.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4A has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about $\frac{1}{2}\lambda$, where $\lambda$ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a transceiver (for example, the transceiver 105 of FIG. 3) controls phase values of one or more phase shifters to control beamforming.

Figure 4B:
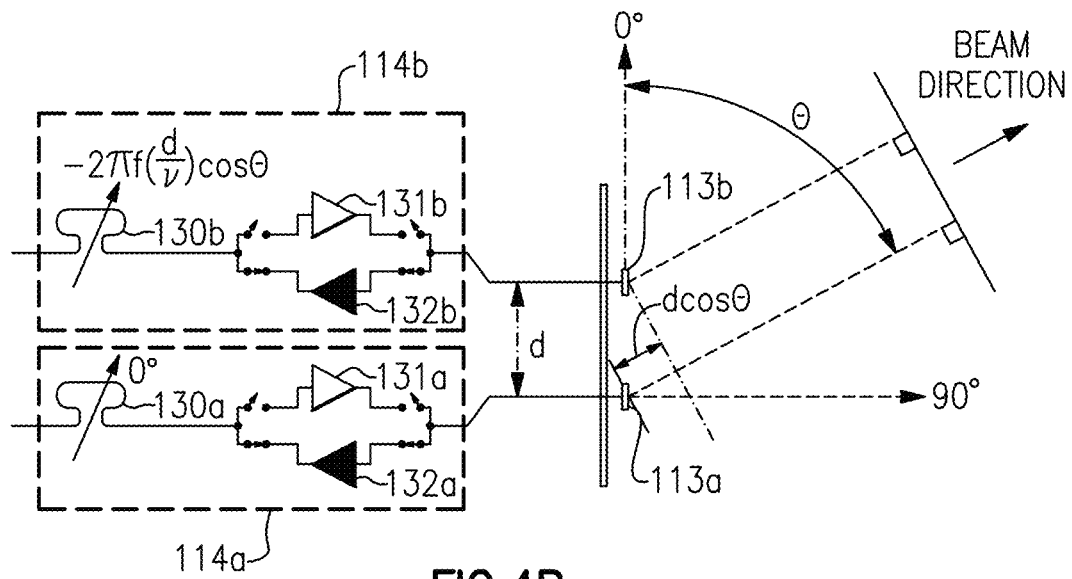
FIG. 4B is a schematic diagram of one example of beamforming to provide a receive beam.

FIG. 4B is a schematic diagram of one example of beamforming to provide a receive beam. FIG. 4B is similar to FIG. 4A, except that FIG. 4B illustrates beamforming in the context of a receive beam rather than a transmit beam.

As shown in FIG. 4B, a relative phase difference between the first phase shifter 130a and the second phase shifter 130b can be selected to about equal to $-\pi f(d/v)\cos\theta$ radians to achieve a desired receive beam angle θ. In implementations in which the distance d corresponds to about $\frac{1}{2}\lambda$, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Moreover, in certain applications, it is desirable for an antenna system to have a tunable bandwidth, thereby providing control over transmit and/or receive frequencies.

The communication networks and systems of FIGS. 1-4B illustrate example radio frequency electronics that can include a reconfigurable antenna system with ground tuning pads. However, the teachings herein are applicable to other implementations of radio frequency electronics.

Examples of Reconfigurable Antenna Systems with Ground Tuning Pads

Reconfigurable antenna systems with ground tuning pads are provided herein. In certain configurations, an antenna system includes a module substrate including a ground plane and a ground tuning pad configured to receive a ground voltage from the ground plane. The antenna system further includes an antenna element and a tuning conductor that is spaced apart from the antenna element and operable to load the antenna element. Furthermore, a switch is electrically connected between the tuning conductor and the ground tuning pad, and operates to selectively connect the tuning conductor to the ground plane by way of the ground tuning pad to provide tuning to the antenna element.

By implementing the antenna system in this manner, antenna characteristics of the antenna element can be controlled. For example, when the switch connects the tuning conductor to the ground plane, the tuning conductor provides a secondary resonance that modifies the operation of the antenna element relative to when the tuning conductor is disconnected from the ground plane (for instance, electrically floating).

The secondary resonance is controlled by characteristics of the ground tuning pad, such as shape and/or size. For instance, the ground tuning pad can include regions of different widths to provide inductance and/or capacitance to achieve desired tuning characteristics. In one example, the ground tuning pad includes at least one narrow region operable to serve as a tuning inductor and at least one wide region operable to serve as a tuning capacitor. In another example, the ground tuning pad includes a wide region and multiple narrow regions that connect the wide region to the ground plane.

In certain implementations, multiple switch-controlled tuning conductors are provided for tuning one or more antenna elements. In one example, an antenna element is tuned by two or more tuning conductors. In a second example, separate tuning conductors are provided for two or more antenna elements. In a third example, a shared tuning conductor is used to tune two or more antenna elements.

Accordingly, selection of the state of switches can control a bandwidth and/or a direction of polarization of the antenna element, thereby providing frequency and/or polarization configurability.

In certain implementations, the antenna element includes a signal feed for receiving an RF signal and a ground feed that is selectively connected to the ground plane via a ground feed switch. Including the ground feed switch provides a further mechanism or knob to tune antenna characteristics. For example, the ground feed switch can be used to modify the antenna element's operational characteristics by either connecting the ground feed to the ground plane or disconnecting the ground feed from the ground plane (for instance, electrically floating the ground feed). In certain configurations, the ground feed switch is connected to the ground plane by way of a ground tuning pad, thereby providing further enhanced flexibility in achieving a desired tuning characteristic.

The switch state of the antenna system can be changed over time, thereby reconfiguring the antenna system to provide desired performance characteristics at a given moment. For example, the state of the switches can be controlled to provide an optimal or near-optimal radiation pattern at a given time for a particular operating environment. Thus, seamless connectivity between a communication device and a base station can be provided as the communication device moves relative to the base station and/or as a signaling environment changes. In one example, the state of the switches is controlled to maintain circular polarization of a communication device on the move.

In certain implementations, the state of the switches is controlled based on feedback parameters of a communication link between UE and a base station. Thus, the switch state can be set using a control loop, via a closed or semi-closed system, to achieve appropriate antenna characteristics.

In one example, the antenna system can be included a communication device that is communicating with a base station. Additionally, a receive strength signal indicator (RSSI), an error rate indicator, and/or other signal from the base station can be used to control selection of the switch state of the communication device. In another example, the antenna system is included in a base station that wirelessly communicates with a communication device. Additionally, an RSSI, an error rate indicator, and/or other signal from the communication device can be used to control selection of the switch state of the base station.

In certain implementations, the antenna element and the tuning conductor are integrated on a module substrate along with the ground plane, the ground tuning pad, and the switch. However, other configurations are possible, such as implementations in which the antenna element and the tuning conductor are implemented on a glass substrate that is connected to a module substrate in which the ground plane, the ground tuning pad, and the switch are integrated. For instance, in a first example, the glass substrate corresponds to a glass panel with an antenna element and a tuning conductor integrated therein. In a second example, the glass substrate is part of an integrated passive devices (IPD) die on which the antenna element and the tuning conductor are fabricated.

Figure 5A:
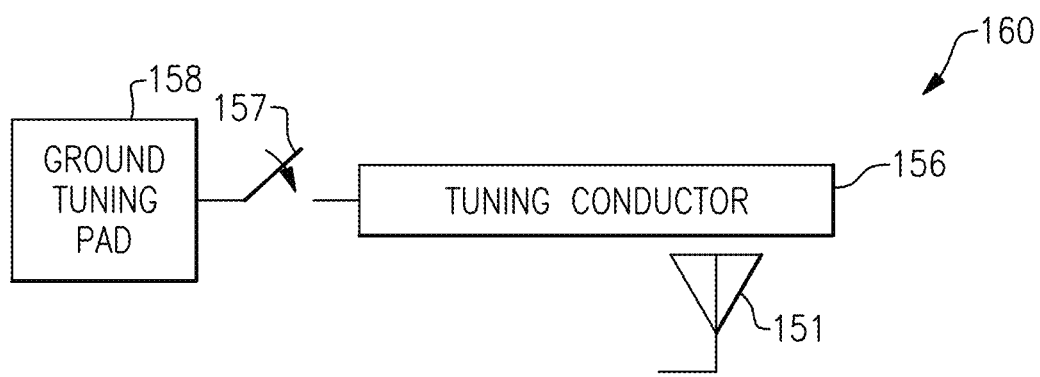
FIG. 5A is a schematic diagram of one embodiment of an antenna system with tuning.

FIG. 5A is a schematic diagram of one embodiment of an antenna system 160 with tuning. The antenna system 160 includes an antenna element 151, a tuning conductor 156, a switch 157, and a ground tuning pad 158.

The tuning conductor 156 is adjacent to and spaced apart from the antenna element 151. Although not electrically connected by metal, the tuning conductor 156 is electromagnetically coupled (for example, capacitively coupled) to the antenna element 151 and operates to load the antenna element 151, thereby impacting one or more characteristics of the antenna element 151. Although the tuning conductor 156 is illustrated as a rectangular strip of metal, the tuning conductor 156 can be shaped in other ways.

The ground tuning pad 158 receives a ground voltage, for instance, from a ground plane.

As shown in FIG. 5A, the switch 157 is electrically connected between the tuning conductor 156 and the ground tuning pad 158. Additionally, the switch 157 serves to selectively connect the tuning conductor 156 to the ground voltage by way of the ground tuning pad 158. Thus, in a first state the switch 157 is closed to connect the tuning conductor 156 to the ground tuning pad 158, and in a second state the switch 157 is opened to disconnect the tuning conductor 156 from the ground tuning pad 158. Opening or closing the switch 157 provides a mechanism to tune an antenna characteristic of the antenna element 151, such as a bandwidth and/or direction of polarization.

By implementing the antenna system 160 in this manner, antenna characteristics of the antenna element 151 can be controlled. For example, when the tuning conductor 156 is connected to ground, the tuning conductor 156 provides a secondary resonance that modifies the operation of the antenna element 151 relative to when the tuning conductor 156 is disconnected from ground (for instance, electrically floating).

The secondary resonance is controlled by characteristics of the ground tuning pad 158, such as the shape and/or size of the conductor serving as the ground tuning pad 158. For instance, the ground tuning pad 158 can include regions of different widths to provide inductance and/or capacitance to thereby achieve desired tuning. In one example, the ground tuning pad 158 includes at least one narrow region operable to serve as a tuning inductor and at least one wide region operable to serve as a tuning capacitor. In another example, the ground tuning pad 158 includes a wide region and multiple narrow regions that connect the wide region to the ground plane.

Various example implementations of the ground tuning pad 158 will be discussed below with reference to FIGS. 6B-7C.

Figure 5B:
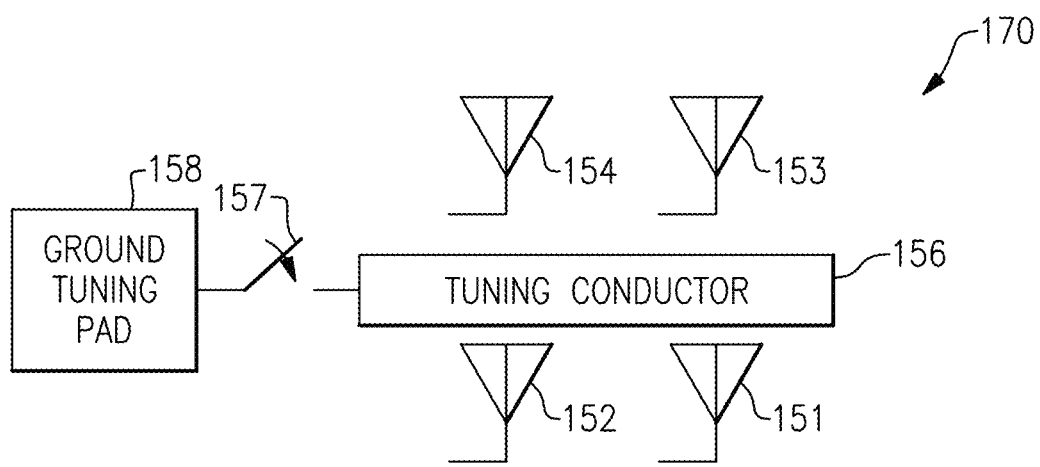
FIG. 5B is a schematic diagram of another embodiment of an antenna system with tuning.

FIG. 5B is a schematic diagram of another embodiment of an antenna system 170 with tuning. The antenna system 170 of FIG. 5B is similar to the antenna system 160 of FIG. 5A, except that the antenna system 170 includes multiple antenna elements 151-154.

Although an example with four antenna elements are shown, the teachings herein are applicable to a wide variety of antenna systems, including configurations using more or fewer antenna elements.

The antenna elements 151-154 can correspond to antenna elements implemented in a wide variety of ways. For instance, examples of antenna elements include, but are not limited to, patch antennas, dipole antennas, ceramic resonators, stamped metal antennas, and/or laser direct structuring antennas.

The tuning capacitor 156 serves to load the antenna elements 151-154. Thus, the state of the switch 157 can be controlled to tune the bandwidth of the antenna elements 151-154.

Although FIG. 5B illustrates an example in which a shared tuning conductor is used to tune two or more antenna elements, the teachings herein are also applicable to implementations in which multiple switch-controlled tuning conductors are provided for tuning one or more antenna elements. In one example, an antenna element is tuned by two or more tuning conductors. In a second example, separate tuning conductors are provided for two or more antenna elements.

Figure 5C:
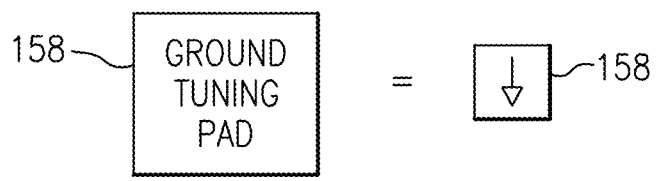
FIG. 5C illustrates two schematic depictions of a ground tuning pad.

FIG. 5C illustrates two schematic depictions of a ground tuning pad 158. The schematic depictions correspond to any embodiment of a ground tuning pad implemented in accordance with the teachings herein. Examples of such ground tuning pads include, but are not limited to, the ground tuning pads of FIGS. 7A-7C.

Figure 6A:
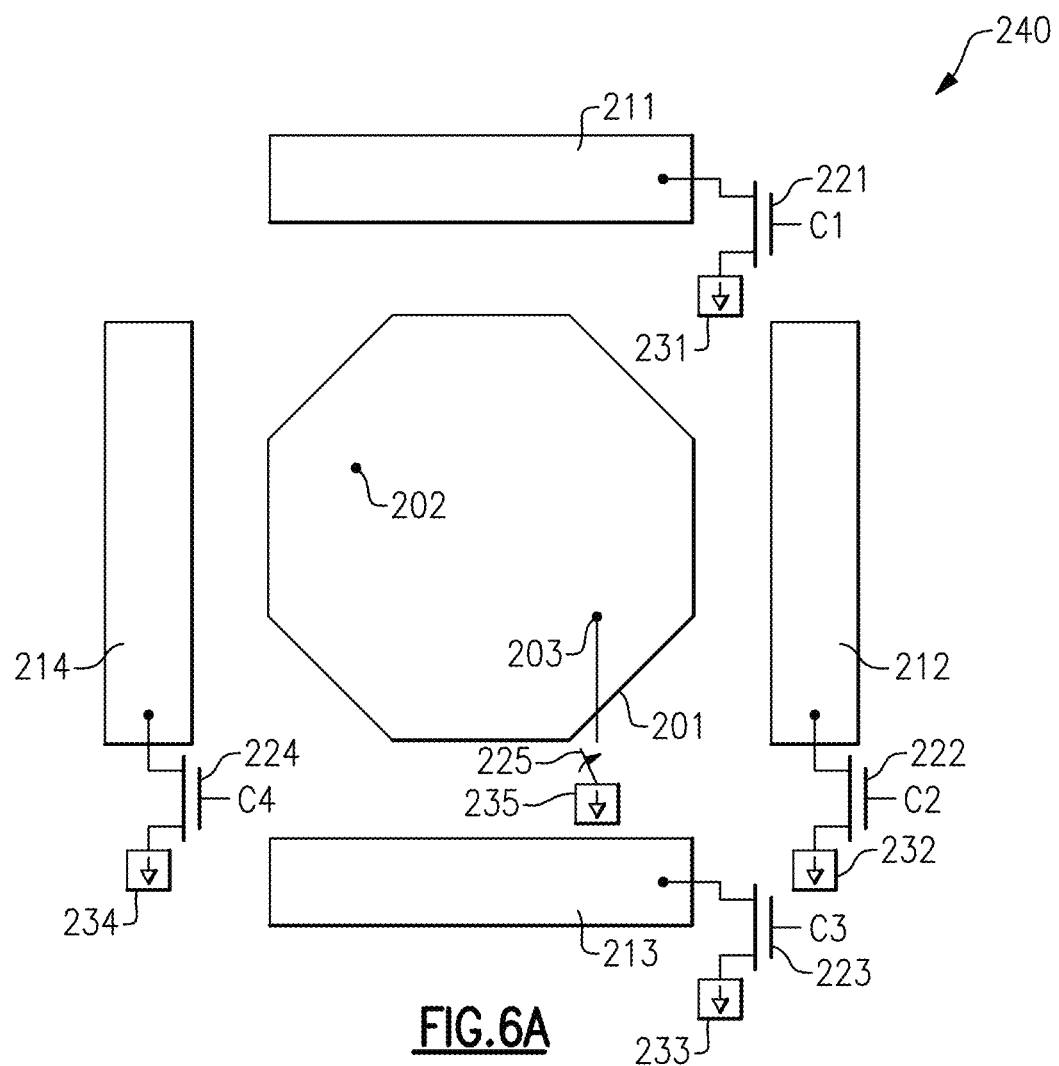
FIG. 6A is a plan view of another embodiment of an antenna system with tuning.

FIG. 6A is a plan view of another embodiment of an antenna system 240 with tuning.

The antenna system 240 includes a patch antenna element 201, a first tuning conductor 211, a second tuning conductor 212, a third tuning conductor 213, a fourth tuning conductor 214, a first transistor switch 221, a second transistor switch 222, a third transistor switch 223, a fourth transistor switch 224, a ground feed switch 225, a first ground tuning pad 231, a second ground tuning pad 232, a third ground tuning pad 233, a fourth ground tuning pad 234, and a fifth ground tuning pad 235.

Although FIG. 6A illustrates an implementation of an antenna system with one patch antenna element, four tuning conductors, five switches, and five ground tuning pads, other configurations are possible. For example, an antenna system can include other numbers and/or types of tuning conductors, switches, and/or ground tuning pads. Moreover, the teachings herein are applicable to antenna systems including additional patch antennas, such as an array of patch antennas, as well as to antenna systems using other types of antenna elements. Accordingly, other implementations are possible.

The patch antenna element 201 includes a signal feed 202 for receiving a signal and a ground feed 203 for receiving ground. In the illustrated embodiment, the antenna system 240 further includes a ground feed switch 225 for selectively connecting the ground feed 203 to ground, thereby providing an additional knob for controlling the antenna characteristics of the antenna system 240. The ground feed switch 203 can be connected to ground via a ground tuning pad 235, thereby providing further control over antenna tuning. In another embodiment, the ground feed switch 225 and/or the ground tuning pad 235 are omitted.

The patch antenna element 201 can be used for transmitting and/or receiving signals, depending on implementation. Accordingly, the patch antenna element 201 can serve as a transmit antenna, a receive antenna, or a transmit/receive antenna. In one example, the signal feed 202 receives a transmit signal, such as a power amplifier output signal. In another example, the signal feed 202 is used to provide a receive signal to a low noise amplifier (LNA) or other receiver circuitry.

Although the illustrated patch antenna element 201 is substantially octagonal in shape, a patch antenna element can be shaped in a wide variety of ways. Furthermore, although the illustrated tuning conductors 211-214 are substantially rectangular in shape, tuning conductors can be shaped in a wide variety of ways.

The patch antenna element 201 and the tuning conductors 211-214 can be implemented in a planar configuration. For example, the antenna system 240 can be implemented on a surface of a substrate, such as a laminate. Thus, the patch antenna element 201 and the tuning conductors 211-214 can be implemented on a patterned conductive layer of a substrate.

In the illustrated embodiment, the tuning conductors 211-214 are spaced apart from the patch antenna element 201, and surround a boundary or perimeter of the patch antenna element 201, but are spaced apart therefrom. For example, the first tuning conductor 211 is positioned adjacent a top side of the patch antenna element 201, the second tuning conductor 212 is positioned adjacent a right side of the patch antenna element 201, the third tuning conductor 213 is positioned adjacent a bottom side of the patch antenna element 201, and the fourth tuning conductor 214 is positioned adjacent a left side of the patch antenna element 201.

Although an example including four rectangular tuning conductors is illustrated, the teachings herein are applicable to implementations including more or fewer tuning conductors and/or tuning conductors with different shapes, sizes, and/or orientations. Accordingly, other implementations are possible.

As shown in FIG. 6A, the transistor switches 221-224 individually control connection of the tuning conductors 211-214 to ground via the ground tuning pads 231-234, respectively. Although an example with a one-to-one correspondence between switches and tuning conductors is shown, in certain implementations one switch controls two or more tuning conductors and/or one tuning conductor is controlled by two or more switches.

In the illustrated embodiment, the first transistor switch 221 is electrically connected between the first tuning conductor 211 and the first ground tuning pad 231, and is controlled by a first control signal C1. Additionally, the second transistor switch 222 is electrically connected between the second tuning conductor 212 and the second ground tuning pad 232, and is controlled by a second control signal C2. Furthermore, the third transistor switch 223 is electrically connected between the third tuning conductor 213 and the third ground tuning pad 233, and is controlled by a third control signal C3. Additionally, the fourth transistor switch 224 is electrically connected between the fourth tuning conductor 214 and the fourth ground tuning pad 234, and is controlled by a fourth control signal C4.

Although an implementation using transistor switches is shown, other implementations of switches are possible, such as implementations using pin diode switches and/or microelectromechanical switches.

The control signals C1-C4 can be generated in a wide variety of ways. In one example, a transceiver of a communications device generates the control signals C1-C4 to thereby control the state of the transistor switches 221-224. In certain implementations, data stored in a programmable memory, such as a non-volatile memory, is used to control the switch state.

The control signals C1-C4 are used to selectively connect the transistor switches 221-224, respectively, to ground, thereby changing the antenna characteristics of the antenna system 240.

Accordingly, the antenna system 240 is reconfigurable by controlling the state of the transistor switches 221-224. Thus, antenna characteristics such as bandwidth and/or polarization can be controlled. For example, implementing the antenna system 240 in this manner can aid in tuning frequency bandwidth and/or steering polarization in a particular direction.

Figure 6B:
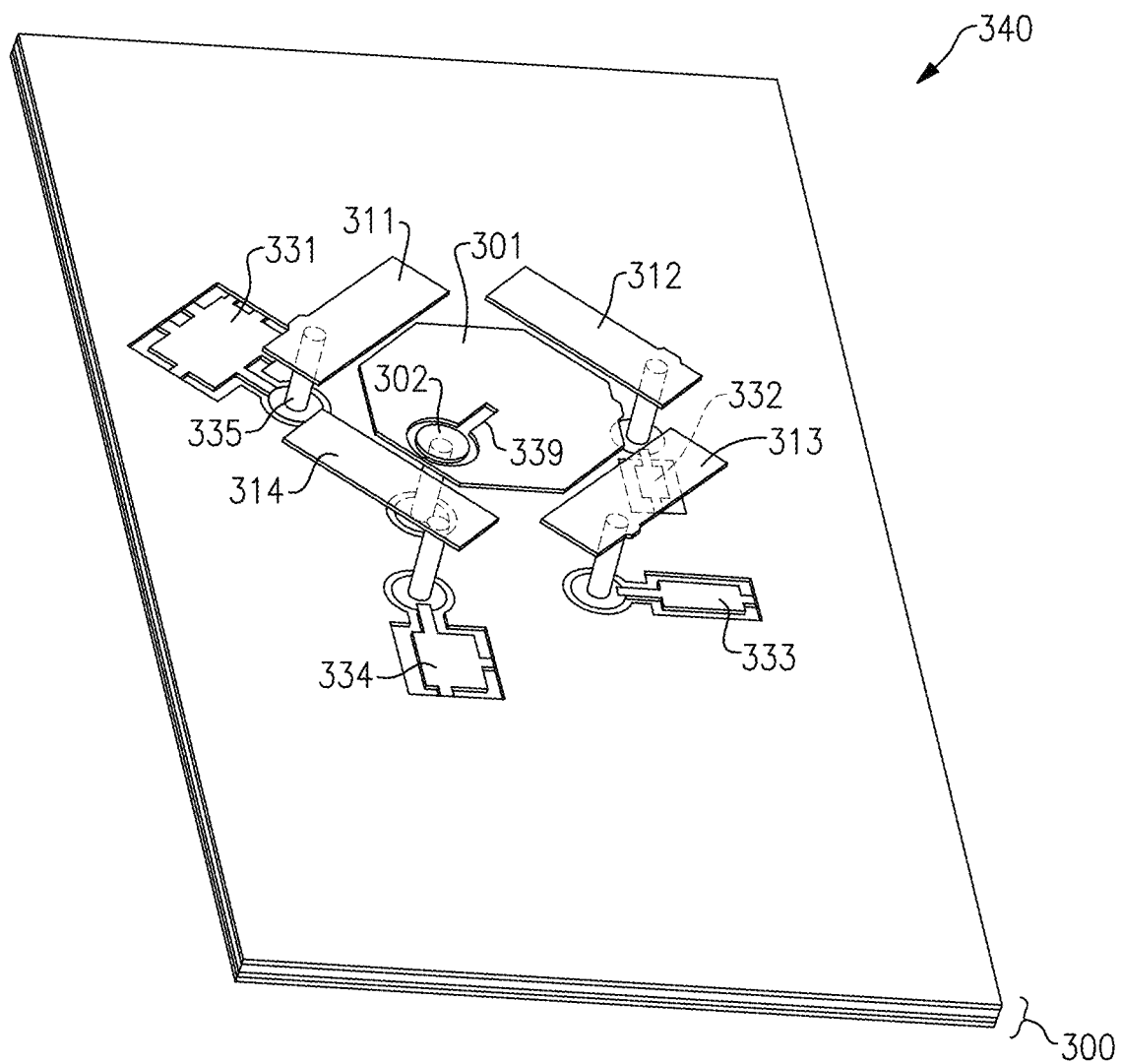
FIG. 6B is a perspective view of one embodiment of an RF module.

FIG. 6B is a perspective view of one embodiment of an RF module 340 with ground tuning. The RF module 340 includes a module substrate 300 including an internal ground plane. The RF module 340 further includes a patch antenna element 301, a first tuning conductor 311, a second tuning conductor 312, a third tuning conductor 313, a fourth tuning conductor 314, a first ground tuning pad 331, a second ground tuning pad 332, a third ground tuning pad 333, and a fourth ground tuning pad 334. With respect to FIG. 6B, certain layers have been depicted transparently so that certain components, such as vias, are visible.

Although not illustrated in FIG. 6B, the RF module 340 further includes a switch connected between each of the tuning conductors 311-314 and the ground tuning pads 331-334, respectively. The switches have been omitted from FIG. 6B for clarity of the figures. However, the switches can be included in a wide variety of locations, for instance, by inserting a switch in series with each of the vias 335 used for connecting to the tuning conductors 311-314. The switches can be implemented in a wide variety of ways, including, for example, using surface mount switches and/or switches fabricated on a semiconductor die or chip.

The patch antenna element 301 includes a signal feed 302 and a ground feed (not illustrated in FIG. 6B). In the illustrated embodiment, the signal feed 302 is implemented as a center conductor that is capacitively coupled to the patch antenna element 301 to thereby feed the patch antenna element 301. Additionally, a slot 339 has been included in the patch antenna element 301 adjacent to the signal feed 302. Including the slot aids in controlling the input impedance into the patch antenna element 301 from the signal feed 302.

Although FIG. 6B illustrates one implementation of an RF module with tuning, the teachings herein are applicable to RF modules implemented in a wide variety of ways. Accordingly, other implementations are possible.

Figure 7A:
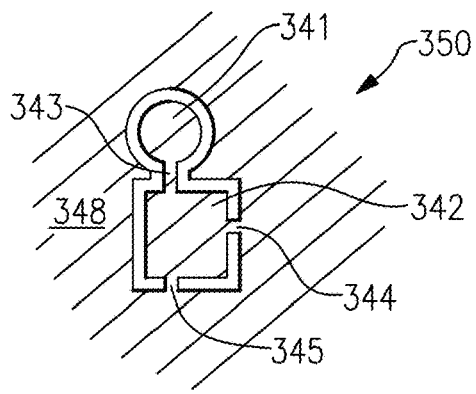
FIG. 7A is schematic diagram of one embodiment of a ground tuning pad.

FIG. 7A is schematic diagram of one embodiment of a ground tuning pad 350. The ground tuning pad 350 is formed on a conductive layer of module substrate that also includes a ground plane 348.

The ground tuning pad 350 includes a switch interface region 341 that is electrically connected to a switch, which in turn is connected to a tuning conductor. In certain implementations, the switch interface region 341 is connected by via to a switch on another layer of the module substrate.

As shown in FIG. 7A, the ground tuning pad 350 further includes a wide or center region 342, which is connected to the switch interface region 341 by a first thin region 343. In this embodiment, the wide region 342 is connected to the ground plane 348 using multiple thin regions, including a second thin region 344 and a third thin region 345.

By implementing the antenna system in this manner, antenna characteristics of the antenna element can be controlled. For example, when the tuning conductor is connected to ground, the tuning conductor provides a secondary resonance that modifies the operation of the antenna element relative to when the tuning conductor is disconnected from ground (for instance, electrically floating).

When a tuning conductor is connected to the ground plane 348 by way of the ground tuning pad 350, a secondary resonance is provided to an antenna element. The secondary resonance is controlled by characteristics of the ground tuning pad 350, such as the shape and/or size of the conductive regions. For instance, the various regions of the ground tuning pad provide inductance and/or capacitance to achieved desired tuning characteristics. For example, narrow regions serve to provide tuning inductance while wide regions serve to provide tuning capacitance.

Figure 7B:
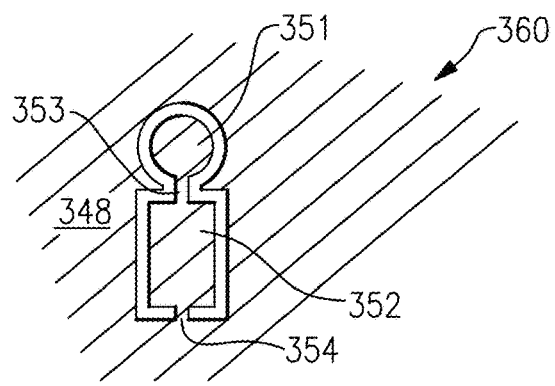
FIG. 7B is schematic diagram of another embodiment of a ground tuning pad.

FIG. 7B is schematic diagram of another embodiment of a ground tuning pad 360. The ground tuning pad 360 illustrates another example of a ground tuning pad for a reconfigurable antenna system. However, the teachings herein are applicable to ground tuning pads implemented in a wide variety of ways.

In the illustrated embodiment, the ground tuning pad 360 includes a switch interface region 351, a wide region 352, a first thin region 353, and a second thin region 354. In this example, the first thin region 353 serves to connect the switch interface region 351 to the wide region 352, and the second thin region 354 serves to connect the wide region 352 to the ground plane 348.

Figure 7C:
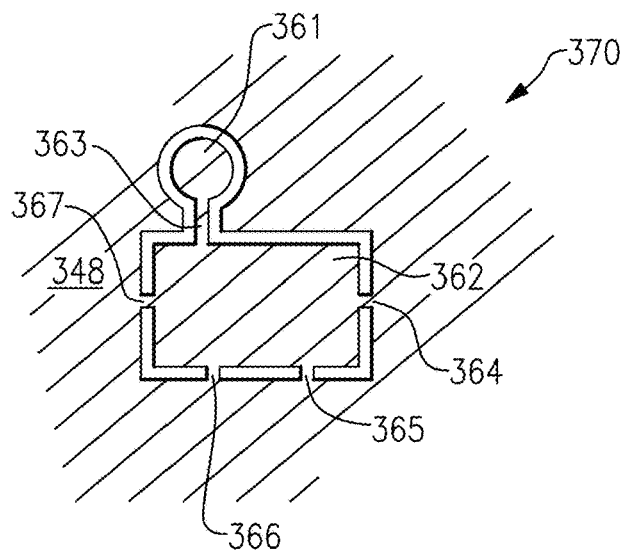
FIG. 7C is schematic diagram of another embodiment of a ground tuning pad.

FIG. 7C is schematic diagram of another embodiment of a ground tuning pad 370. The ground tuning pad 370 illustrates another example of a ground tuning pad for a reconfigurable antenna system. However, the teachings herein are applicable to ground tuning pads implemented in a wide variety of ways.

In the illustrated embodiment, the ground tuning pad 370 includes a switch interface region 361, a wide region 362, a first thin region 363, a second thin region 364, a third thin region 365, a fourth thin region 366, and a fifth thin region 367. In this example, the first thin region 363 serves to connect the switch interface region 351 to the wide region 362. Additionally, the wide region 362 is connected to the ground plane 348 using multiple thin regions, including the second thin region 364, the third thin region 365, the fourth thin region 366, and the fifth thin region 367.

FIG. 8A is a cross-section of another embodiment of an RF module 460. The RF module 460 includes a laminated substrate or laminate 401 including a first conductive layer 421, a second conductive layer 422, a third conductive layer 423, a fourth conductive layer 424, a solder mask 431, a first dielectric layer 441, a second dielectric layer 442, a third dielectric layer 443, and vias 450. The RF module 460 further includes an IC 410 integrated in the laminate 401.

The first conductive layer 421 includes one or more antenna elements, such as an antenna element 401. In certain implementations, the antenna element 401 is a patch antenna element. The first conductive layer 421 further includes one or more tuning conductors, such as the tuning conductor 411. The IC 410 includes one or more switches 451. Additionally, vias 450 have been used to connect the one or more tuning conductors to corresponding switches 451 fabricated on the IC 410.

For clarity of the figures, patterning of the second conductive layer 422, the third conductive layer 433, and the third conductive layer 434 is not illustrated. However, conductive layers can be patterned in a wide variety of ways. Furthermore, although one example of vias 450 is depicted, the vias 450 can be placed in a wide variety of ways.

The RF module 460 further includes a ground plane formed on one or more conductive layers. In certain implementations, the ground plane 460 is formed on the second conductive layer 422, the third conductive layer 423, and/or the fourth conductive layer 424.

One or more ground tuning pads can be formed adjacent to the ground plane. For example, in certain implementations, a ground tuning pad is formed by patterning a conductive layer, such as the second conductive layer 422, the third conductive layer 423, and/or the fourth conductive layer 424. The ground tuning pad receives a ground voltage from the ground plane, and connects to a corresponding switch 451 of the IC 410.

In the illustrated embodiment, the IC 410 is positioned internally to the laminate 401. Implementing the RF module 460 in this manner reduces conductive route lengths, thereby enhancing performance and alleviating routing congestion. However, other implementations are possible. For example, in another embodiment, switches are implemented as surface mount components and/or an IC on a surface of the laminate 401.

In certain implementations, the IC 410 further includes a front-end system (for instance, one or more signal conditioning circuits), a transceiver, and/or other circuitry of a communications device. Although an implementation with one semiconductor chip is shown, the teachings herein are applicable to modules with additional chips or without chips.

In certain implementations, the IC 410 includes an interface, such as a Mobile Industry Processor Interface (MIPI) Radio Frequency Front End (RFFE) bus, an inter-integrated circuit (I²C) bus, and/or a general-purpose input/output (GPIO) bus that receives data for controlling the switch state.

The laminate 401 can be implemented with layers of various thicknesses. In one specific example, the solder mask 431 is 20 μm thick, the conductive layers 421-424 are each 15 μm thick, the first dielectric layer 441 is 300 μm thick, and the second and third dielectric layers 442-443 are each 15 μm thick. Although one specific example of layer thicknesses has been provided, a laminate can be implemented in a wide variety of ways. For example, the number of, composition of, and/or thicknesses of laminate layers can vary widely based on implementation and/or application.

FIG. 8B is a cross-section of another embodiment of an RF module 470. The RF module 470 of FIG. 8B is similar to the RF module 460 of FIG. 8A, except that the RF module 470 of FIG. 8B illustrates a different location of the IC 410. In particular, the IC 410 is attached by solder balls 461 to a side of the laminate 410 opposite the tuning conductors and antenna elements, in this embodiment.

FIG. 8C is a cross-section of the RF module 460 of FIG. 8A attached to a printed circuit board (PCB) 481 according to one embodiment. In the illustrated embodiment, the RF module 460 is attached by solder balls 471 to the PCB 481. For example, attachment can be provided by way of a ball grid array (BGA). Although one example of attaching the RF module 460 to a PCB is shown, the RF module 460 can be attached to a multitude of structures in a wide variety of ways.

FIG. 8D is a cross-section of the RF module 470 of FIG. 8B attached to a PCB 481 according to one embodiment. In the illustrated embodiment, the RF module 470 is attached by solder balls 471 to the PCB 481. Although one example of attaching the RF module 470 is shown, the RF module 470 can be attached in other ways.

Figure 8E:
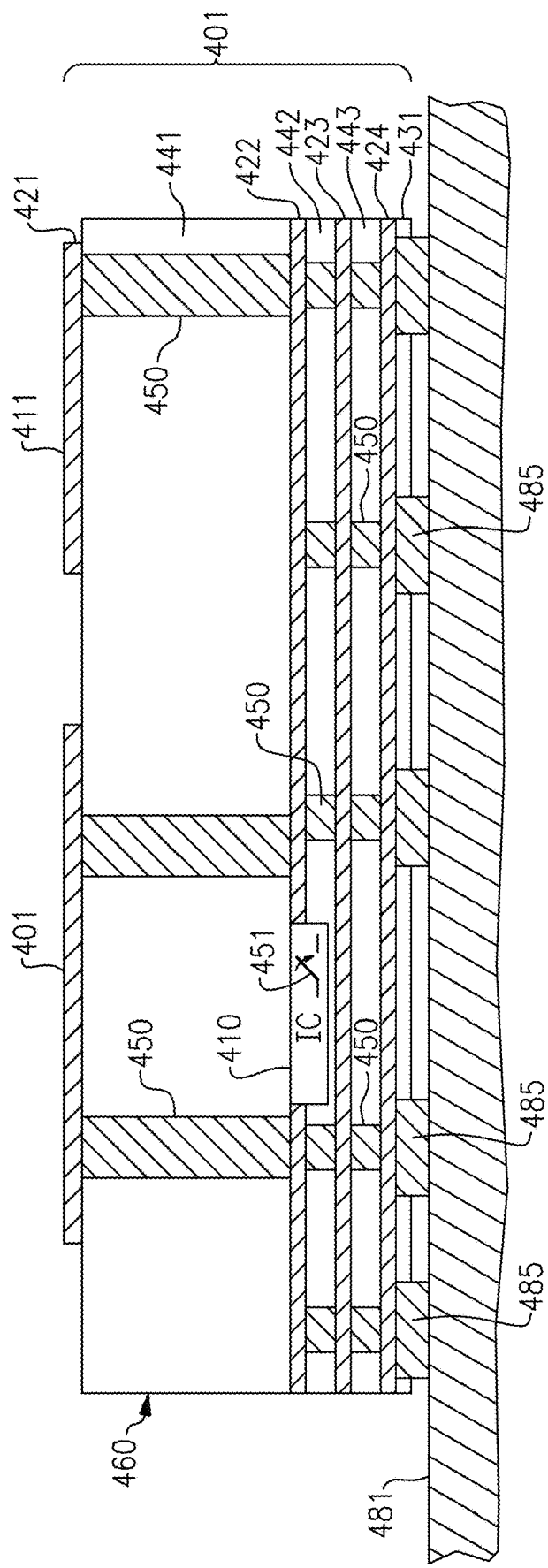
FIG. 8E is a cross-section of the RF module of FIG. 8A attached to a printed circuit board according to another embodiment.

FIG. 8E is a cross-section of the RF module 460 of FIG. 8A attached to a PCB 481 according to another embodiment. In the illustrated embodiment, the RF module 460 is attached by pads 485 to the PCB 481. For example, attachment can be provided by way of a land grid array (LGA). Although another example of attaching the RF module 460 to a PCB is shown, the RF module 460 any suitable attachment scheme can be used to connect the RF module 460 to a PCB or other structure.

Figure 8F:
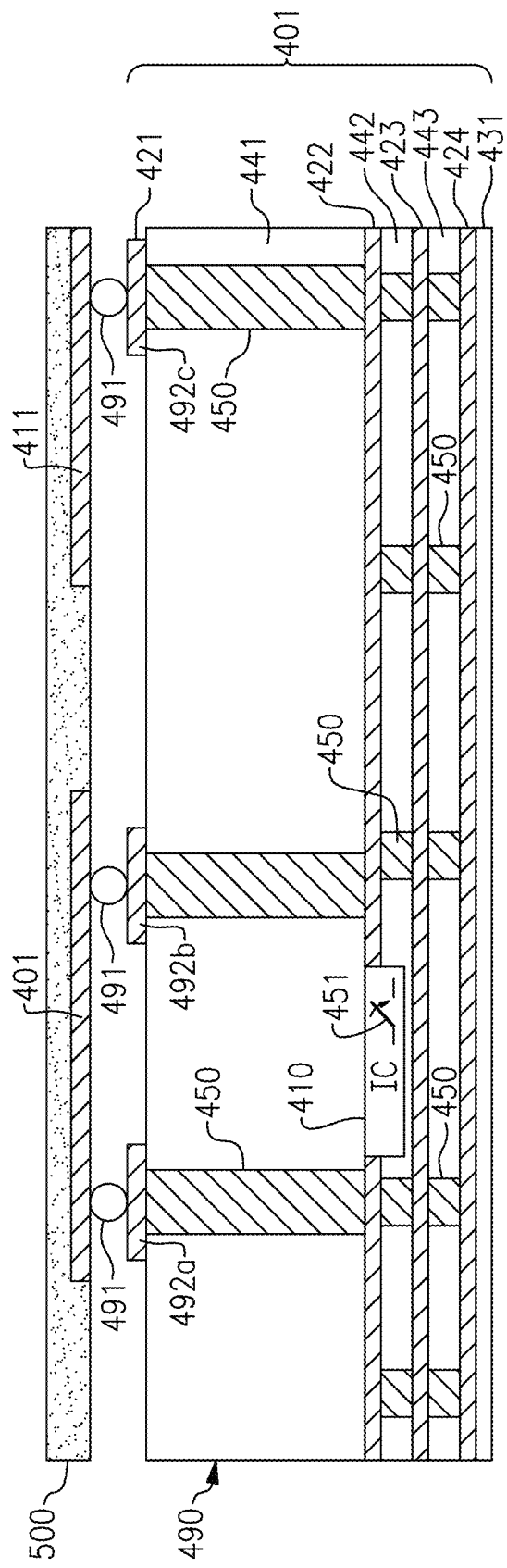
FIG. 8F is a cross-section of an RF module and a glass substrate according to one embodiment.

FIG. 8F is a cross-section of an RF module 490 and a glass substrate 500 according to one embodiment. The RF module 490 of FIG. 8F is similar to the RF module 460 of FIG. 8A, except that the RF module 490 omits the antenna element 401 and tuning conductor 411. Rather, the glass substrate 500 includes the antenna element 401 and the tuning conductor 411 thereon.

As shown in FIG. 8F, the first conductive layer 421 of the RF module 490 has been patterned to include pads for connecting to the glass substrate 500 via solder balls 491. For example, the pads can include a first pad 492a for connecting to a signal feed of the antenna element 401, a second pad 492b for connecting to a ground feed of the antenna element 401, and a third pad 492c for connecting to the tuning conductor 411.

The glass substrate 500 can include one or more metal layers included thereon. Thus, the glass substrate 500 can include multiple layers, in certain implementations. Although illustrated as of equal width as the laminate 401, the glass substrate 500 can have narrower width, greater width, or equal width as the laminate 401. Furthermore, the glass substrate 500 can have any suitable thickness, including a thickness less than the laminate 401, greater than the laminate 401, or equal to the laminate 401.

Although not shown in FIG. 8A, the RF module 490 is also connected to a PCB in certain implementations. For instance, in one example, a PCB is included on a side of laminate 401 opposite the glass substrate 500, and the RF module 490 is coupled to the PCB by way of a BGA, LGA, or other suitable interface.

Figure 8G:
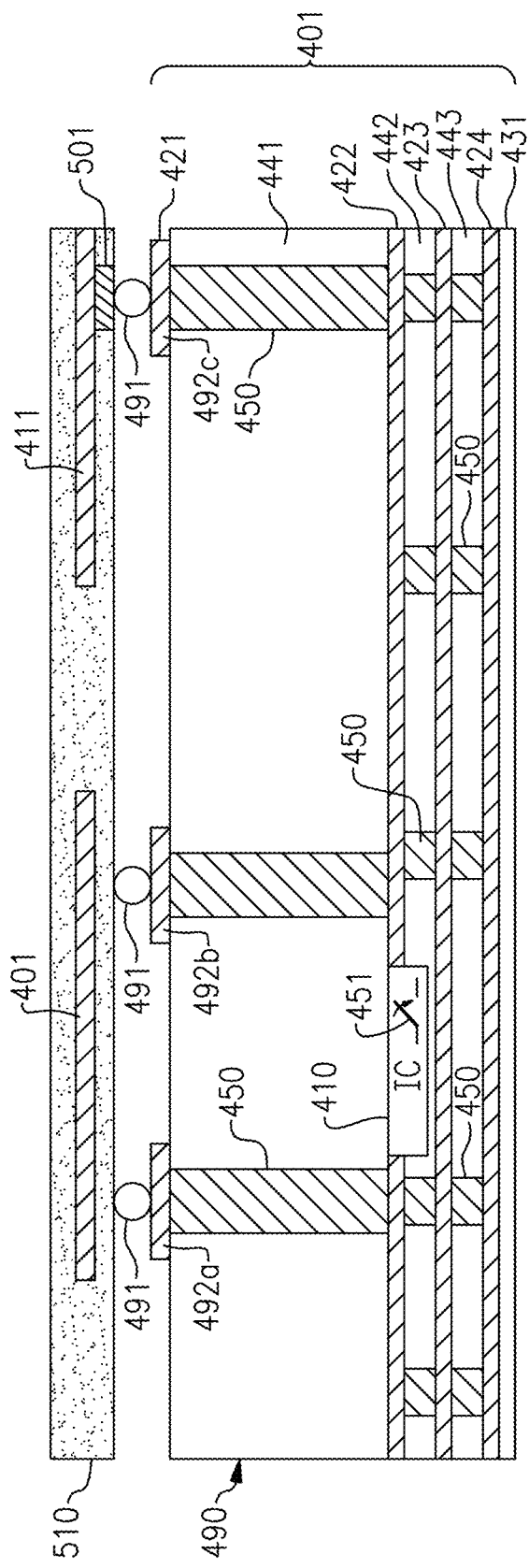
FIG. 8G is a cross-section of an RF module and a glass substrate according to another embodiment.

FIG. 8G is a cross-section of an RF module 490 and a glass substrate 510 according to another embodiment. In the illustrated embodiment, the glass substrate 510 includes a conductive layer internal to the glass substrate 510 and including the antenna element 401 and the tuning conductor 411. Additionally, a via 501 is included in the glass substrate 510 for electrically connecting the third pad 492c of the RF module 490 to the tuning conductor 411 via metallization.

As shown in FIG. 8B, corresponding vias in the glass substrate 510 are omitted for connecting the first pad 492a and the second pad 492b to the antenna element 401 via metallization. Rather, electromagnetic coupling (for instance, capacitive coupling) is used to feed the antenna element 401.

The teachings herein are applicable to antenna elements in which a signal feed and/or a ground feed is provided by an electrical connection by way of metallization as well as to antenna elements in which a signal feed and/or a ground feed is provided by electromagnetic coupling.

Figure 8H:
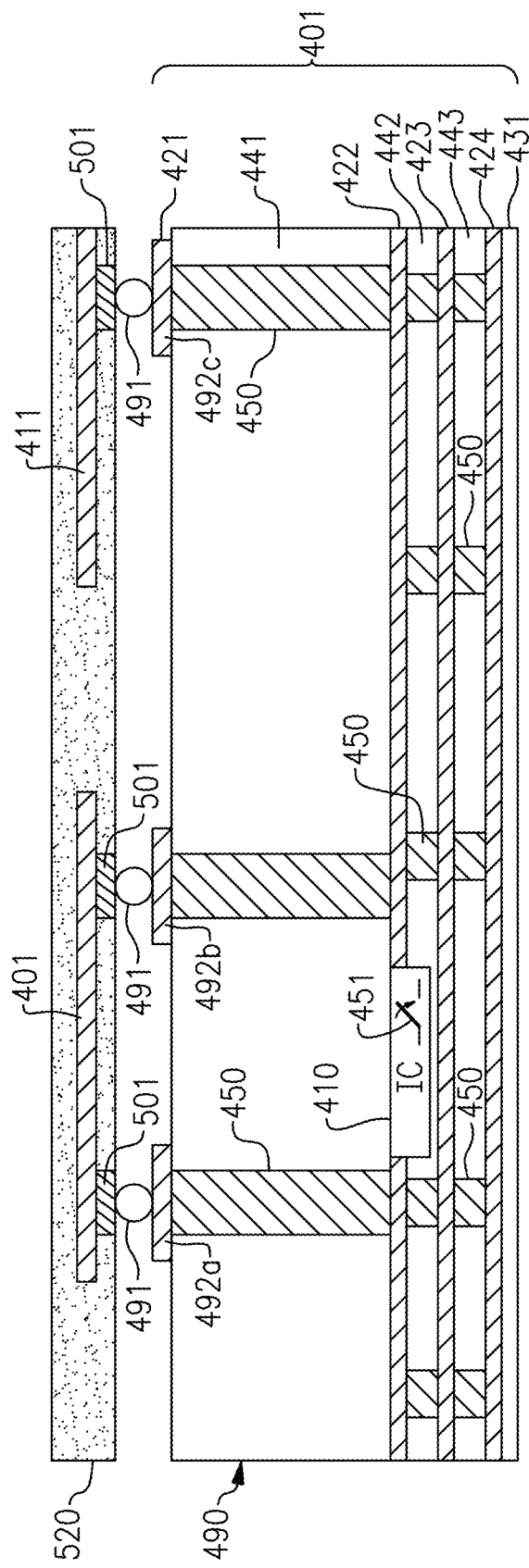
FIG. 8H is a cross-section of an RF module and a glass substrate according to another embodiment.

FIG. 8H is a cross-section of an RF module 490 and a glass substrate 520 according to another embodiment. The glass substrate 520 of FIG. 8H is similar to the glass substrate 510 of FIG. 8G, except that the glass substrate 520 of FIG. 8H includes vias 501 for connecting not only the third pad 492c to the tuning conductor 411, but also for connecting the first pad 492a to the antenna element 401 and the second pad 492b to the antenna element 401.

Figure 8I:
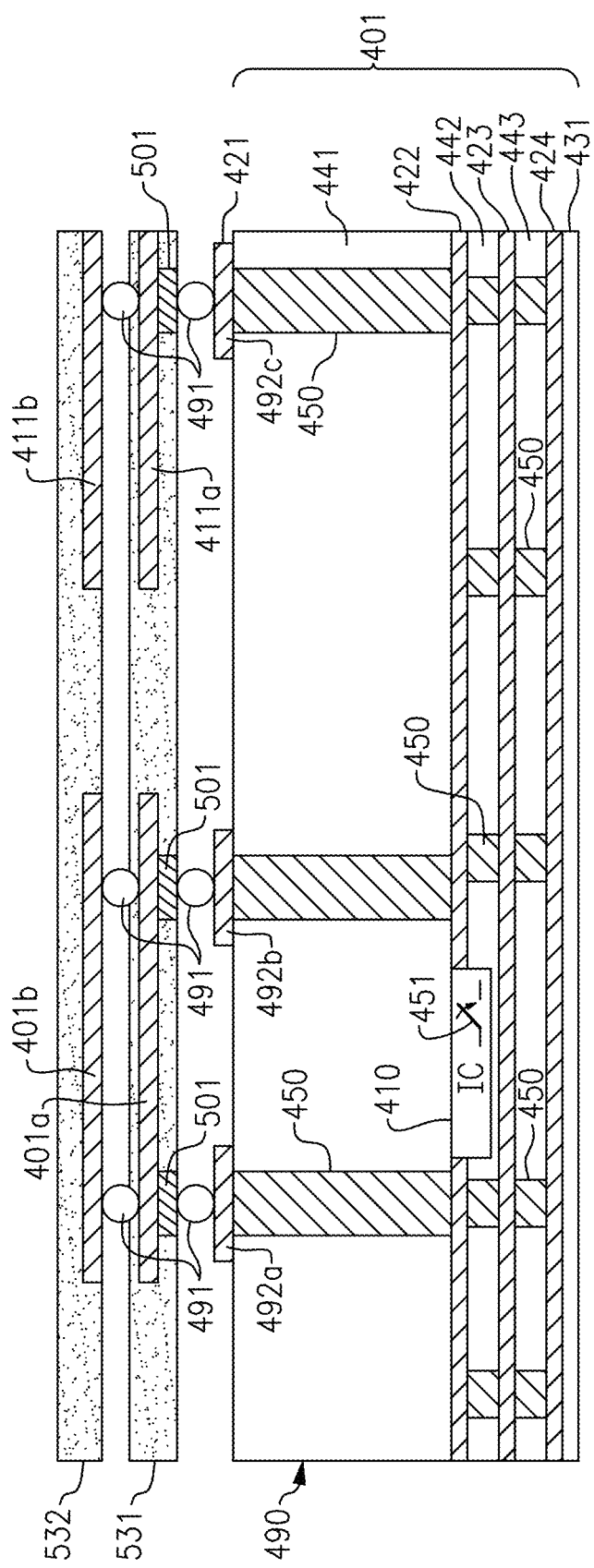
FIG. 8I is a cross-section of an RF module and stacked glass substrates according to one embodiment.

FIG. 8I is a cross-section of an RF module 490 and stacked glass substrates according to one embodiment. As shown in FIG. 8I, a first glass substrate 531 is coupled to the pads 492a-492c of the RF module 490 by way of solder balls 491, in this example. The first glass substrate 531 includes a first antenna element 401a, a first tuning conductor 411a, and vias 501.

Additionally, the second glass substrate 532 is stacked over the first glass substrate 531, such that the first glass substrate 531 is positioned between the RF module 490 and the second glass substrate 532. The second glass substrate 532 includes a second antenna element 401b and a second tuning conductor 411b, which are connected by solder balls 491 to the first antenna element 401a and the first tuning conductor 411a, respectively.

In certain embodiments herein, two or more glass substrates are stacked. Furthermore, the glass substrates can include antenna elements to provide an antenna array and/or three-dimensional antenna structures. Moreover, the glass substrates can include tuning conductors to provide a tuning conductor array and/or three-dimensional tuning structures.

Figure 8J:
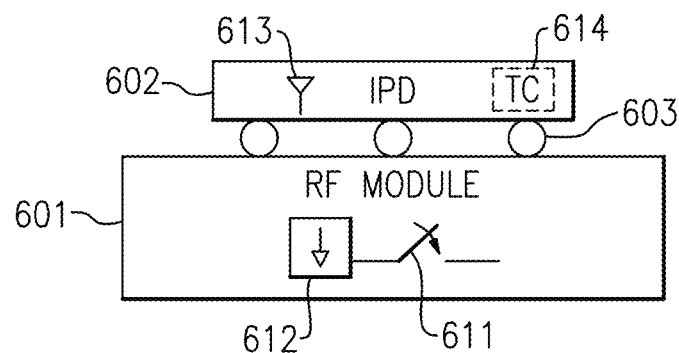
FIG. 8J is a cross-section of an RF module and an IPD die according to one embodiment.

FIG. 8J is a cross-section of an RF module 601 and an IPD die 602 according to one embodiment. The RF module 601 includes at least one switch 611 and at least one ground tuning pad 612 implemented in accordance with the teachings herein. As shown in FIG. 8J, an IPD die 602 is attached to the RF module 601 via balls 603 or other suitable attachment mechanism. The IPD die 602 includes at least one antenna element 613 and at least one tuning conductor 614. In certain implementations, the IPD die 602 includes a glass substrate on which the antenna element 613 and the tuning conductor 614 are fabricated.

Figure 8K:
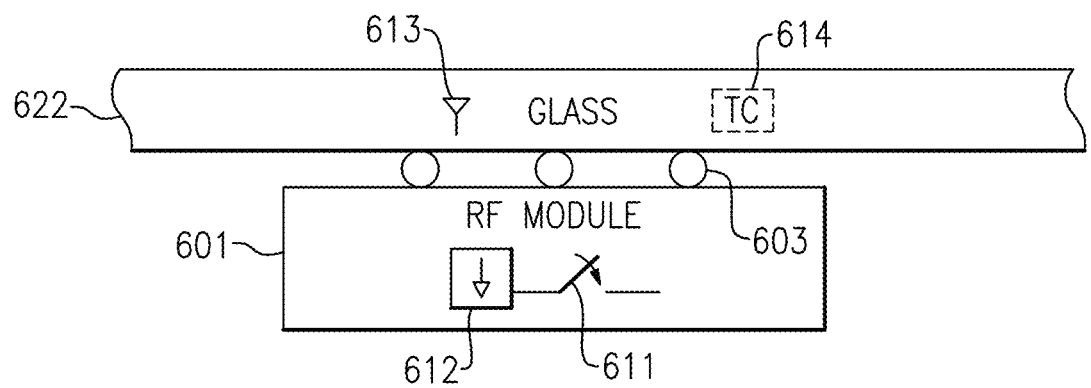
FIG. 8K is a cross-section of an RF module and a glass panel according to one embodiment.

FIG. 8K is a cross-section of an RF module 601 and a glass panel 622 according to one embodiment. The RF module 601 includes at least one switch 611 and at least one ground tuning pad 612 implemented in accordance with the teachings herein. As shown in FIG. 8K, the glass panel 622 is attached to the RF module 601 via balls 603 or other suitable attachment mechanism. The glass panel 622 includes at least one antenna element 613 and at least one tuning conductor 614. In one embodiment, the glass panel 622 corresponds to a display, for instance a touch screen display of a mobile device, tablet, or other UE.

Figure 9:
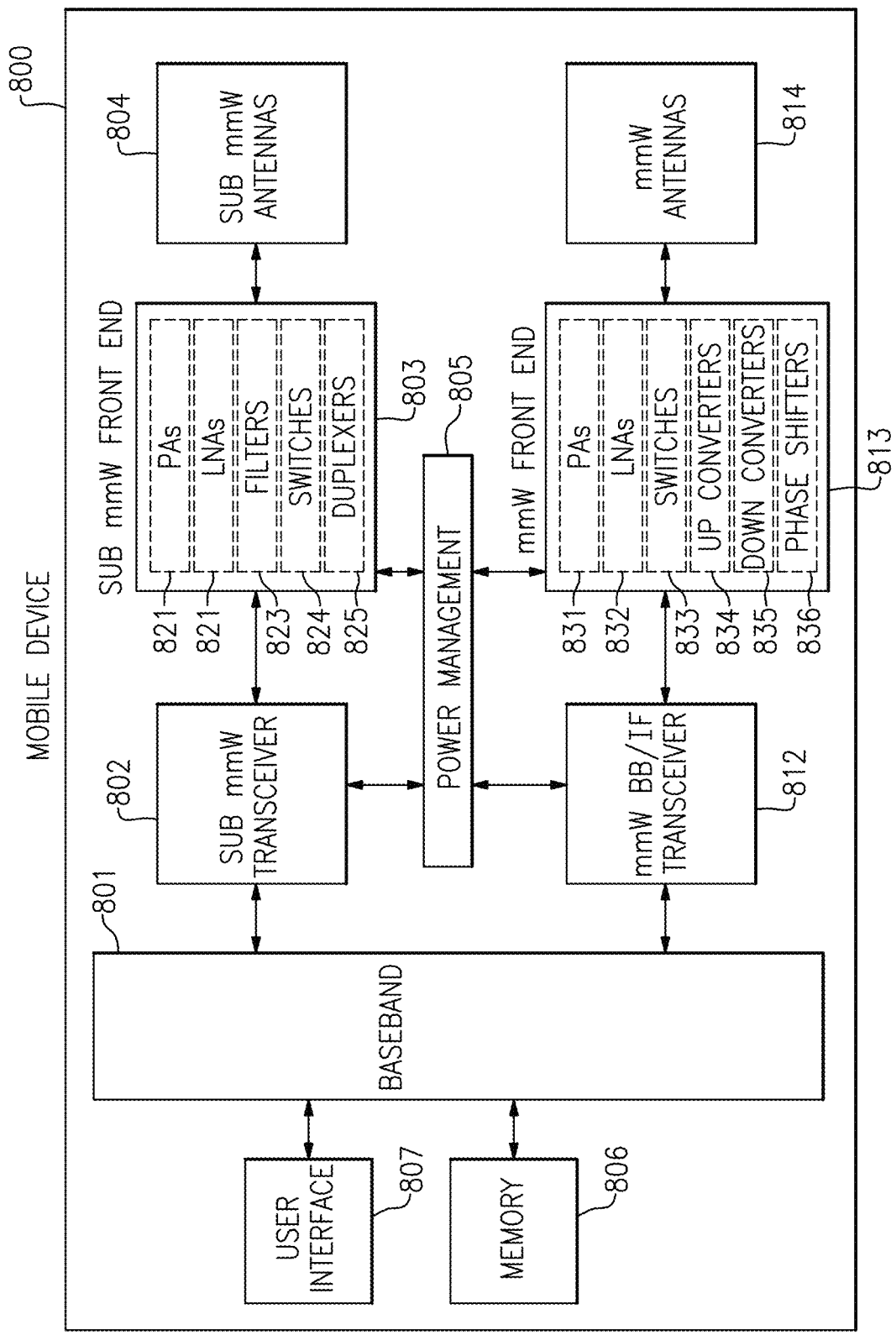
FIG. 9 is a schematic diagram of one embodiment of a mobile device.

FIG. 9 is a schematic diagram of one embodiment of a mobile device 800. The mobile device 800 includes a baseband system 801, a sub millimeter wave (mmW) transceiver 802, a sub mmW front end system 803, sub mmW antennas 804, a power management system 805, a memory 806, a user interface 807, a mmW baseband (BB)/intermediate frequency (IF) transceiver 812, a mmW front end system 813, and mmW antennas 814.

The mobile device 800 of FIG. 9 illustrates one example of a mobile device that can include a reconfigurable antenna system with ground tuning pads. However, the teachings herein are applicable to other implementations of mobile devices.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

In the illustrated embodiment, the sub mmW transceiver 802, sub mmW front end system 803, and sub mmW antennas 804 serve to transmit and receive centimeter waves and other radio frequency signals below millimeter wave frequencies. Additionally, the mmW BB/IF transceiver 812, mmW front end system 813, and mmW antennas 814 serve to transmit and receive millimeter waves. Although one specific example is shown, other implementations are possible, including, but not limited to, mobile devices operating using circuitry operating over different frequency ranges and wavelengths.

The sub mmW transceiver 802 generates RF signals for transmission and processes incoming RF signals received from the sub mmW antennas 804. It will be understood that various functionalities associated with the transmission and receiving of RF signals can be achieved by one or more components that are collectively represented in FIG. 9 as the sub mmW transceiver 802. In one example, separate components (for instance, separate circuits or dies) can be provided for handling certain types of RF signals.

The sub mmW front end system 803 aids is conditioning signals transmitted to and/or received from the antennas 804. In the illustrated embodiment, the front end system 803 includes power amplifiers (PAs) 821, low noise amplifiers (LNAs) 822, filters 823, switches 824, and duplexers 825. However, other implementations are possible.

For example, the sub mmW front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The sub mmW antennas 804 can include antennas used for a wide variety of types of communications. For example, the sub mmW antennas 804 can include antennas for transmitting and/or receiving signals associated with a wide variety of frequencies and communications standards.

The mmW BB/IF transceiver 812 generates millimeter wave signals for transmission and processes incoming millimeter wave signals received from the mmW antennas 814. It will be understood that various functionalities associated with the transmission and receiving of RF signals can be achieved by one or more components that are collectively represented in FIG. 9 as the mmW transceiver 812. The mmW BB/IF transceiver 812 can operate at baseband or intermediate frequency, based on implementation.

The mmW front end system 813 aids is conditioning signals transmitted to and/or received from the mmW antennas 814. In the illustrated embodiment, the front end system 803 includes power amplifiers 831, low noise amplifiers 832, switches 833, up converters 834, down converters 835, and phase shifters 836. However, other implementations are possible. In one example, the mobile device 800 operates with a BB mmW transceiver, and up converters and down-converters are omitted from the mmW front end system. In another example, the mmW front end system further includes filters for filtering millimeter wave signals.

The mmW antennas 814 can include antennas used for a wide variety of types of communications. The mmW antennas 814 can include antenna elements implemented in a wide variety of ways, and in certain configurations the antenna elements are arranged to form one or more antenna arrays. Examples of antenna elements for millimeter wave antenna arrays include, but are not limited to, patch antennas, dipole antenna elements, ceramic resonators, stamped metal antennas, and/or laser direct structuring antennas.

In certain implementations, the mobile device 800 supports MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the mobile device 800 operates with beamforming. For example, the mmW front end system 803 includes phase shifters having variable phase controlled by the transceiver 802. Additionally, the phase shifters are controlled to provide beam formation and directivity for transmission and/or reception of signals using the mmW antennas 814. For example, in the context of signal transmission, the phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the phases are controlled such that more signal energy is received when the signal is arriving to the antenna array from a particular direction.

The baseband system 801 is coupled to the user interface 807 to facilitate processing of various user input and output (I/O), such as voice and data. The baseband system 801 provides the sub mmW and mmW transceivers with digital representations of transmit signals, which are processed by the transceivers to generate RF signals for transmission. The baseband system 801 also processes digital representations of received signals provided by the transceivers. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers of the front end systems. For example, the power management system 805 can be configured to change the supply voltage(s) provided to one or more of the power amplifiers to improve efficiency, such as power added efficiency (PAE).

In certain implementations, the power management system 805 receives a battery voltage from a battery. The battery can be any suitable battery for use in the mobile device 800, including, for example, a lithium-ion battery.

CONCLUSION

Some of the embodiments described above have provided examples of dynamic beam control in connection with wireless communication devices. However, the principles and advantages of the embodiments can be used for any other systems or apparatus that benefit from any of the circuits and systems described herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency module comprising:
 a module substrate including a ground plane;
 a ground tuning pad configured to receive a ground voltage from the ground plane and including a plurality of metal regions of different widths;
 a via in the module substrate, the via configured to couple to a tuning conductor that loads an antenna element; and
 a switch electrically connected between the via and the ground tuning pad, the switch operable to selectively connect the via to the ground plane by way of the ground tuning pad to thereby tune the antenna element, the plurality of metal regions having an impedance that modifies a resonant frequency of the antenna element when the switch is closed.

2. The radio frequency module of claim 1 wherein the ground tuning pad and the ground plane are formed on a common conductive layer of the module substrate.

3. The radio frequency module of claim 1 wherein the antenna element and the tuning conductor are implemented on a common conductive layer of the module substrate.

4. The radio frequency module of claim 1 wherein a state of the switch is operable to tune a bandwidth of the antenna element.

5. An antenna system comprising:
a first antenna element;
a first tuning conductor that loads the first antenna element; and
a radio frequency module including a module substrate including a ground plane, a first ground tuning pad configured to receive a ground voltage from the ground plane and that includes a plurality of metal regions of different widths, a first via in the module substrate and coupled to the first tuning conductor, and a first switch electrically connected between the first via and the first ground tuning pad, the first switch operable to selectively connect the first via to the ground plane by way of the first ground tuning pad to thereby tune the first antenna element, the plurality of metal regions having an impedance that modifies a resonant frequency of the first antenna element when the first switch is closed.

6. The antenna system of claim 5 wherein the first ground tuning pad and the ground plane are formed on a common conductive layer of the module substrate.

7. The antenna system of claim 5 wherein the first antenna element and the first tuning conductor are implemented on a common conductive layer of the module substrate.

8. The antenna system of claim 5 wherein the first antenna element and the first tuning conductor are integrated on a glass substrate that is coupled to the module substrate.

9. The antenna system of claim 5 wherein a state of the first switch is operable to tune a bandwidth of the first antenna element.

10. The antenna system of claim 5 further comprising a second tuning conductor that loads the first antenna element.

11. The antenna system of claim 10 wherein the radio frequency module further includes a second ground tuning pad configured to receive the ground voltage from the ground plane, a second via in the module substrate and coupled to the second tuning conductor, and a second switch electrically connected between the second tuning conductor and the second ground tuning pad.

12. The antenna system of claim 10 wherein the first tuning conductor and the second tuning conductor are positioned along different sides of the first antenna element.

13. The antenna system of claim 5 further comprising a second antenna element loaded by the first tuning conductor.

14. A mobile device comprising:
a power amplifier configured to generate a radio frequency transmit signal;
an antenna array including a first antenna element configured to transmit the radio frequency transmit signal and a first tuning conductor that loads the first antenna element; and;
a radio frequency module including a module substrate including a ground plane, a first ground tuning pad configured to receive a ground voltage from the ground plane and that includes a plurality of metal regions of different widths, a first via in the module substrate and coupled to the first tuning conductor, and a first switch electrically connected between the first via and the first ground tuning pad, the first switch operable to selectively connect the first via to the ground plane by way of the first ground tuning pad to thereby tune the first antenna element, the plurality of metal regions having an impedance that modifies a resonant frequency of the first antenna element when the first switch is closed.

15. The mobile device of claim 14 wherein the first ground tuning pad and the ground plane are formed on a common conductive layer of the module substrate.

16. The mobile device of claim 14 wherein the antenna array is integrated on a glass substrate that is coupled to the module substrate.

17. The mobile device of claim 14 wherein a state of the first switch is operable to tune a bandwidth of the first antenna element.

18. The mobile device of claim 14 further comprising a second tuning conductor that loads the first antenna element.

19. The mobile device of claim 18 wherein the radio frequency module further includes a second ground tuning pad configured to receive the ground voltage from the ground plane, a second via in the module substrate and coupled to the second tuning conductor, and a second switch electrically connected between the second tuning conductor and the second ground tuning pad.

20. The mobile device of claim 14 wherein the antenna array further includes a second antenna element loaded by the first tuning conductor.

\* \* \* \* \*